(12) United States Patent
Kim et al.

(10) Patent No.: US 9,570,680 B2
(45) Date of Patent: Feb. 14, 2017

(54) METHOD FOR FABRICATING ELECTRONIC DEVICES HAVING SEMICONDUCTOR MEMORY UNIT

(71) Applicant: SK hynix Inc., Icheon-Si (KR)

(72) Inventors: Jae-Heon Kim, Icheon-Si (KR); Sung-Koo Lee, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 189 days.

(21) Appl. No.: 14/145,782

(22) Filed: Dec. 31, 2013

(65) Prior Publication Data

US 2015/0050794 A1 Feb. 19, 2015

(30) Foreign Application Priority Data

Aug. 16, 2013 (KR) .................. 10-2013-0097370

(51) Int. Cl.
| | |
|---|---|
| H01L 21/461 | (2006.01) |
| H01L 45/00 | (2006.01) |
| H01L 21/027 | (2006.01) |
| H01L 21/033 | (2006.01) |
| H01L 21/311 | (2006.01) |
| H01L 43/08 | (2006.01) |
| H01L 27/22 | (2006.01) |
| H01L 27/24 | (2006.01) |
| H01L 21/768 | (2006.01) |

(52) U.S. Cl.
CPC ........... *H01L 45/16* (2013.01); *H01L 21/0273* (2013.01); *H01L 21/0337* (2013.01); *H01L 21/31144* (2013.01); *H01L 21/76816* (2013.01); *H01L 27/222* (2013.01); *H01L 27/2463* (2013.01); *H01L 43/08* (2013.01); *H01L 45/06* (2013.01); *H01L 45/08* (2013.01); *H01L 45/1233* (2013.01); *H01L 45/1675* (2013.01)

(58) Field of Classification Search
CPC ............. H01L 21/0273; H01L 21/0337; H01L 21/76816; H01L 21/31144
See application file for complete search history.

(56) References Cited

U.S. PATENT DOCUMENTS

| | | | |
|---|---|---|---|
| 7,887,996 B2 * | 2/2011 | Liu | ...................... H01L 21/0334 430/270.1 |
| 2008/0068861 A1 * | 3/2008 | Lin | ................... G02F 1/133603 362/613 |

FOREIGN PATENT DOCUMENTS

| | | |
|---|---|---|
| KR | 10-2010-0134415 A | 12/2010 |
| KR | 10-2012-0004109 A | 1/2012 |
| KR | 10-2012-0126442 A | 11/2012 |
| KR | 10-2012-0126725 A | 11/2012 |

* cited by examiner

*Primary Examiner* — Bradley K Smith
(74) *Attorney, Agent, or Firm* — Perkins Coie LLP

(57) ABSTRACT

Devices and method based on disclosed technology include, among others, a method for capable of providing asymmetrical arrangement of hole patterns while improving non-uniformity of an electronic device. Specifically, a method for fabricating hole patterns in one implementation includes forming a mask pattern which is defined with hole patterns of an asymmetrical arrangement with different longitudinal and transverse intervals, over a layer to be etched; and etching the layer to be etched, using the mask pattern as an etch barrier.

19 Claims, 43 Drawing Sheets

METHOD FOR FABRICATING ELECTRONIC DEVICES HAVING SEMICONDUCTOR MEMORY UNIT

CROSS-REFERENCE TO RELATED APPLICATIONS

The present application claims priority of Korean Patent Application No. 10-2013-0097370, entitled "METHOD FOR MANUFACTURING HOLE PATTERN, AND ELECTRONIC DEVICE AND METHOD FOR FABRICATING THE SAME" and filed on Aug. 16, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which a method for fabricating a semiconductor device, capable of improving non-uniformity of hole patterns themselves and forming the hole patterns of an asymmetrical arrangement with different longitudinal and transverse intervals, is provided.

In one aspect, a method for fabricating an electronic device is provided to include a semiconductor memory unit that includes: forming a mask pattern which is defined with hole patterns of an asymmetrical arrangement with different longitudinal and transverse intervals, over a layer to be etched; and etching the layer to be etched, using the mask pattern as an etch barrier.

In particular, the forming of the mask pattern may include: forming a photoresist pattern with a plurality of openings which are defined by first regions having undergone optical processing and second regions not having undergone optical processing, over a sacrificial layer, forming a gap filling layer to fill the openings of the second regions of the photoresist pattern not having undergone optical processing; and etching the sacrificial layer using the first regions of the photoresist pattern having undergone optical processing and the gap filling layer as etch barriers, and forming a sacrificial pattern which is defined with the hole patterns of the asymmetrical arrangement with the different longitudinal and transverse intervals.

Also, the plurality of openings may have a uniform longitudinal and transverse interval.

Moreover, the forming of the gap filling layer may include: forming a reaction layer which fills the openings over the photoresist pattern; reacting the second regions of the photoresist pattern not having undergone optical processing with the reaction layer, and forming a crosslinked layer; and removing the reaction layer which has not link. The reaction layer may include a RELACS (resist enhancement lithography assisted by chemical shrink) layer.

In addition, the forming of the mask pattern may include: forming pillar patterns with a uniform longitudinal and transverse interval, over a sacrificial layer, forming a gap filling layer to fill spaces among the pillar patterns; forming line masks over the gap filling layer and the pillar patterns to expose pillar patterns with a predetermined interval; removing the pillar patterns which are exposed by the line masks; and etching the sacrificial layer using remaining pillar patterns and the gap filling layer as etch barriers, and forming a sacrificial pattern which is defined with the hole patterns of the asymmetrical arrangement with the different longitudinal and transverse intervals.

Furthermore, the forming of the mask pattern may include: forming line type neutral material patterns over a sacrificial layer; forming a photoresist pattern which is defined with contact holes with a uniform longitudinal and transverse interval, over the sacrificial layer including the neutral material patterns; forming a copolymer which fills the contact holes and includes a hydrophilic group and a hydrophobic group, over the photoresist pattern; assembling the copolymer such that, in contact holes defined over the neutral material patterns, a polymer with the hydrophobic group is formed at center portions of the contact holes and a polymer with the hydrophilic group is formed on sidewalls of the contact holes; selectively removing the polymer with the hydrophobic group; and etching the neutral material patterns and the sacrificial layer using the copolymer and the photoresist pattern as etch barriers, and forming a sacrificial pattern which is defined with the hole patterns of the asymmetrical arrangement with the different longitudinal and transverse intervals.

In another aspect, a method for fabricating an electronic device is provided to include a semiconductor memory unit that includes: forming a first interlayer dielectric layer over a substrate; forming a first mask pattern which is defined with hole patterns of an asymmetrical arrangement with different longitudinal and transverse intervals, over the first interlayer dielectric layer; etching the first interlayer dielectric layer using the first mask pattern as an etch barrier, and forming first contact holes which expose the substrate; forming first contact plugs by filling a conductive material in the first contact holes; forming variable resistance elements to be connected with the first contact plugs; forming a second interlayer dielectric layer over the first interlayer dielectric layer and the variable resistance elements; forming second contact plugs to pass through the second interlayer dielectric layer and be connected with the variable resistance elements; and forming conductive lines over the second interlayer dielectric layer to be connected with the second contact plugs.

Specifically, the forming of the first mask pattern may include: forming a photoresist pattern with a plurality of openings which are defined by first regions having undergone optical processing and second regions not having undergone optical processing, over a sacrificial layer; forming a gap filling layer to fill the openings of the second regions of the photoresist pattern not having undergone optical processing; and etching the sacrificial layer using the first regions of the photoresist pattern having undergone optical processing and the gap filling layer as etch barriers, and forming a sacrificial pattern which is defined with the hole patterns of the asymmetrical arrangement with the different longitudinal and transverse intervals.

Besides, the forming of the first mask pattern may include: forming pillar patterns with a uniform longitudinal and transverse interval, over a sacrificial layer, forming a first gap filling layer to fill spaces among the pillar patterns; forming line patterns over the first gap filling layer and the pillar patterns such that non-exposed regions and exposed regions of the pillar patterns are alternately repeated; removing the pillar patterns which are exposed by the line patterns; and etching the sacrificial layer using remaining pillar patterns and the first gap filling layer as etch barriers, and forming a sacrificial pattern which is defined with the hole patterns of the asymmetrical arrangement with the different longitudinal and transverse intervals.

Further, the forming of the first mask pattern may include: forming line type neutral material patterns over a sacrificial layer; forming a photoresist pattern which is defined with contact holes with a uniform longitudinal and transverse interval, over the sacrificial layer including the neutral material patterns; forming a copolymer which fills the contact holes and includes a hydrophilic group and a hydrophobic group, over the photoresist pattern; assembling the copolymer such that, in contact holes defined over the neutral material patterns, a polymer with the hydrophobic group is formed at center portions of the contact holes and a polymer with the hydrophilic group is formed on sidewalls of the contact holes; selectively removing the polymer with the hydrophobic group; and etching the neutral material patterns and the sacrificial layer using the copolymer and the photoresist pattern as etch barriers, and forming a sacrificial pattern which is defined with the hole patterns of the asymmetrical arrangement with the different longitudinal and transverse intervals.

Also, the forming of the second contact plugs may include: forming a second mask pattern which is defined with hole patterns of an asymmetrical arrangement with different longitudinal and transverse intervals, over the second interlayer dielectric layer; etching the second interlayer dielectric layer using the second mask pattern as an etch barrier, and forming second contact holes which expose top surfaces of the variable resistance elements; and forming second contact plugs by filling a conductive material in the second contact holes.

Moreover, the forming of the second mask pattern may include: forming a photoresist pattern with a plurality of openings which are defined by first regions having undergone optical processing and second regions not having undergone optical processing, over a sacrificial layer; forming a gap filling layer to fill the openings of the second regions of the photoresist pattern not having undergone optical processing; and etching the sacrificial layer using the first regions of the photoresist pattern having undergone optical processing and the gap filling layer as etch barriers, and forming a sacrificial pattern which is defined with the hole patterns of the asymmetrical arrangement with the different longitudinal and transverse intervals.

In addition, the forming of the second mask pattern may include: forming pillar patterns with a uniform longitudinal and transverse interval, over a sacrificial layer; forming a first gap filling layer to fill spaces among the pillar patterns; forming line patterns over the first gap filling layer and the pillar patterns such that non-exposed regions and exposed regions of the pillar patterns are alternately repeated; removing the pillar patterns which are exposed by the line patterns; and etching the sacrificial layer using remaining pillar patterns and the first gap filling layer as etch barriers, and forming a sacrificial pattern which is defined with the hole patterns of the asymmetrical arrangement with the different longitudinal and transverse intervals.

Furthermore, the forming of the second mask pattern may include: forming line type neutral material patterns over a sacrificial layer; forming a photoresist pattern which is defined with contact holes with a uniform longitudinal and transverse interval, over the sacrificial layer including the neutral material patterns; forming a copolymer which fills the contact holes and includes a hydrophilic group and a hydrophobic group, over the photoresist pattern; assembling the copolymer such that, in contact holes defined over the neutral material patterns, a polymer with the hydrophobic group is formed at center portions of the contact holes and a polymer with the hydrophilic group is formed on sidewalls of the contact holes; selectively removing the polymer with the hydrophobic group; and etching the neutral material patterns and the sacrificial layer using the copolymer and the photoresist pattern as etch barriers, and forming a sacrificial pattern which is defined with the hole patterns of the asymmetrical arrangement with the different longitudinal and transverse intervals.

Besides, before the forming of the conductive lines, the method may further include: etching the second interlayer dielectric layer and the first interlayer dielectric layer between the variable resistance elements, and forming third contact holes which expose the substrate; and forming third contact plugs by filling a conductive material in the third contact holes.

Further, the forming of the third contact holes may include: forming a third mask pattern which is defined with hole patterns of an asymmetrical arrangement with different longitudinal and transverse intervals, over the second interlayer dielectric layer; and etching the second interlayer dielectric layer and the first interlayer dielectric layer using the third mask pattern as an etch barker, and forming the third contact holes which expose the substrate.

Also, the forming of the third mask pattern may include: forming a photoresist pattern with a plurality of openings which are defined by first regions having undergone optical processing and second regions not having undergone optical processing, over a sacrificial layer; forming a gap filling layer to fill the openings of the second regions of the photoresist pattern not having undergone optical processing; and etching the sacrificial layer using the first regions of the photoresist pattern having undergone optical processing and the gap filling layer as etch barriers, and forming a sacrificial pattern which is defined with the hole patterns of the asymmetrical arrangement with the different longitudinal and transverse intervals.

Moreover, the forming of the third mask pattern may include: forming pillar patterns with a uniform longitudinal and transverse interval, over a sacrificial layer; forming a first gap filling layer to fill spaces among the pillar patterns; forming line patterns over the first gap filling layer and the pillar patterns such that non-exposed regions and exposed regions of the pillar patterns are alternately repeated; removing the pillar patterns which are exposed by the line patterns; and etching the sacrificial layer using remaining pillar patterns and the first gap filling layer as etch barriers, and forming a sacrificial pattern which is defined with the hole patterns of the asymmetrical arrangement with the different longitudinal and transverse intervals.

Furthermore, the forming of the third mask pattern may include: forming line type neutral material patterns over a sacrificial layer; forming a photoresist pattern which is defined with contact holes with a uniform longitudinal and transverse interval, over the sacrificial layer including the neutral material patterns; forming a copolymer which fills the contact holes and includes a hydrophilic group and a hydrophobic group, over the photoresist pattern; assembling the copolymer such that, in contact holes defined over the neutral material patterns, a polymer with the hydrophobic group is formed at center portions of the contact holes and a polymer with the hydrophilic group is formed on sidewalls of the contact holes; selectively removing the polymer with the hydrophobic group; and etching the neutral material patterns and the sacrificial layer using the copolymer and the photoresist pattern as etch barriers, and forming a sacrificial pattern which is defined with the hole patterns of the asymmetrical arrangement with the different longitudinal and transverse intervals.

In an implementation, an electronic device includes a semiconductor memory, the semiconductor memory including: a first interlayer dielectric layer formed over a substrate; first contact plugs connected to the substrate by passing through the first interlayer dielectric layer and having an asymmetrical arrangement with different longitudinal and transverse intervals; variable resistance elements connected to the first contact plugs; a second interlayer dielectric layer formed over an entire structure including the first interlayer dielectric layer; second contact plugs connected to the variable resistance elements by passing through the second interlayer dielectric layer; third contact plugs connected to the substrate by passing through the second and first interlayer dielectric layers between adjacent variable resistance elements; and conductive lines connected to the second contact plugs and the third contact plugs.

Also, the second contact plugs or the third contact plugs or both may have an asymmetrical arrangement with different longitudinal and transverse intervals.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the variable resistance element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

Thanks to the electronic device and the method for fabricating the same according to the above implementations, it is possible to form hole patterns of an asymmetrical arrangement with different longitudinal and transverse intervals, by using optical processing and a crosslinked layer.

In an implementation, an electronic device includes a semiconductor memory, the semiconductor memory including: a first interlayer dielectric layer formed over a substrate; first contact plugs passing through the first interlayer dielectric layer and having an asymmetrical arrangement with different longitudinal and transverse intervals; variable resistance elements formed on the first interlayer dielectric layer, each variable resistance element electrically connected to each of the first contact plugs; a second interlayer dielectric layer formed over an entire structure including the first interlayer dielectric layer; second contact plugs passing through the second interlayer dielectric layer, each second contact plug electrically connected to each of the variable resistance elements; third contact plugs connected to the substrate by passing through the second and first interlayer dielectric layers between adjacent variable resistance elements; and conductive lines connected to the second contact plugs and the third contact plugs.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

The electronic device may further include a processing system which including a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the variable resistance element is part of the auxiliary memory device or the main memory device in the processing system.

The electronic device may further include a data storage system which including a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

The electronic device may further include a memory system which including a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In one aspect, a method for fabricating an electronic device is provided to include a semiconductor memory unit that includes: providing a photoresist pattern with a plurality of repeated patterns with uniform longitudinal and transverse intervals; covering some of the plurality of repeated patterns such that an underlying layer has first portions exposed through the repeated patterns and second portions not exposed through the repeated patterns; performing etching the underlying layer to form a mask pattern to have hole patterns of an asymmetrical arrangement with different longitudinal and transverse intervals. The repeated patterns may be hole or pillar shaped patterns. The covering of some of the plurality of repeated patterns may include performing selective optical processing for the photoresist pattern so that first regions and second regions are formed in the photoresist pattern and that each repeated pattern is defined by either the first regions or the second regions; providing a reaction layer that reacts with the second regions of the photoresist pattern to cover some of the repeated openings defined by the second regions. The performing selective optical processing may include using a reticle such that beams are not irradiated to regions of the photoresist pattern where the hole patterns are not to be formed and that beams are irradiated to regions of the photoresist pattern where hole patterns are to be formed. The covering of some of the plurality of repeated patterns may include etching hard mask layer by using the photoresist pattern as an etch barrier to form pillar hard mask patterns; forming gap filling patterns between pillar hard mask patterns to cover spaces between the pillar hard mask patterns; forming line mask patterns including exposed regions where the pillar hard mask patterns are exposed and non-exposed regions where the pillar hard mask patterns are not exposed, the exposed regions and the non-exposed regions being alternately arranged; and removing the pillar hard mask patterns that are exposed through the line mask pattern.

In one aspect, a method for fabricating an electronic device is provided to include a semiconductor memory unit that includes: forming line neutral material patterns; forming a photoresist pattern defining hole patterns with uniform longitudinal and transverse intervals such that hole patterns formed on the line neutral material patterns and hole patterns not formed on the line neutral material patterns are alternately arranged; providing a block copolymer to cover the hole patterns, the block copolymer including a hydrophobic group and a hydrophilic group; assembling the block copolymer such that the hydrophobic group is formed between sidewalls of the hole patterns formed on the neutral material patterns and that the hydrophilic group is formed on the sidewalls of the hole patterns formed where the neutral material patterns are provided and in the hole patterns formed where the line neutral material patterns are provided; selectively removing the hydrophobic polymer; etching the neutral material patterns such that an underlying layer is exposed only through the etched neutral material pattern; etching the underlying layer to define hole patterns of an asymmetrical arrangement with different longitudinal and transverse intervals.

Also, it is possible to form hole patterns of an asymmetrical arrangement with different longitudinal and transverse intervals, by using a selective mask process.

Accordingly, since it is possible to form hole patterns of an asymmetrical arrangement with different longitudinal and transverse intervals while improving non-uniformity of hole patterns themselves, the yield of a semiconductor device may be increased.

These and other aspects, implementations and associated advantages are described in greater detail in the drawings, the description and the claims.

DETAILED DESCRIPTION

Figure 1A:
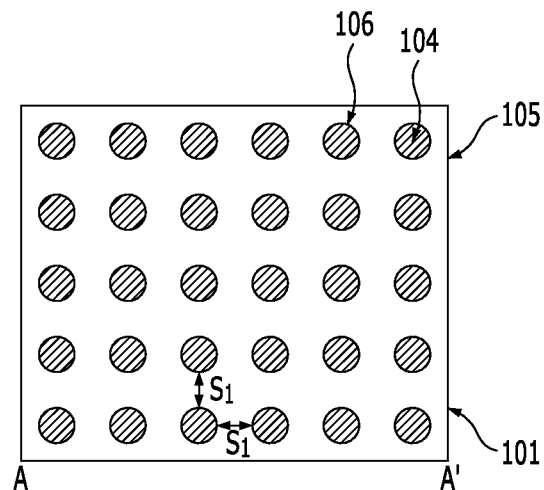
FIGS. 1A to 1H are exemplary plan views explaining a method for fabricating a mask pattern.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following implementations of the disclosed technology in this patent document can be used to provide a method for fabricating a mask pattern defining hole patterns of an asymmetrical arrangement with different longitudinal and transverse intervals, and a method for fabricating a semiconductor device using the mask pattern. Such a semiconductor device can be used in various electronic devices or appliances. In general, a photolithography process proceeds in the following manners. A specific chemical material (a photoresist) induces a chemical reaction when it receives light and is changed in its properties. By using a mask with a desired pattern, light is selectively irradiated to a photoresist to form the same pattern as the pattern of the mask. The photolithography process may comprise an application process for applying a photoresist such as a general photographic film, an exposure process for selectively irradiating light using a mask, and a development process for removing portions of the photoresist having received light by using a developer and thereby forming a pattern.

If a short wavelength light source is used, it may be difficult to fabricate a highly integrated semiconductor device with fine patterns. In particular, if hole patterns have an asymmetrical arrangement with different longitudinal and transverse intervals, since the light introduced into the hole patterns acts differently in longitudinal and transverse directions. Thus, non-uniformity is caused in the hole patterns, and cab reduce the yield of the semiconductor device fabrication. In recognition of the above, exemplary implementations of fabrication using masks are provided in this patent document and the disclosed fabrication can be used to provide a method for fabricating a mask, capable of improving non-uniformity of hole patterns while achieving an asymmetrical arrangement of the hole patterns with different longitudinal and transverse intervals, and a method for fabricating a semiconductor device using the mask.

FIGS. 1A to 1H are exemplary plan views explaining a method for fabricating a mask pattern in accordance with an implementation of this patent document. FIGS. 2A to 2H are exemplary cross-sectional views taken along the lines A-A' of FIGS. 1A to 1H. FIGS. 3A to 3H are exemplary perspective views explaining the method for fabricating a mask pattern based on the disclosed technology.

Figure 2A:
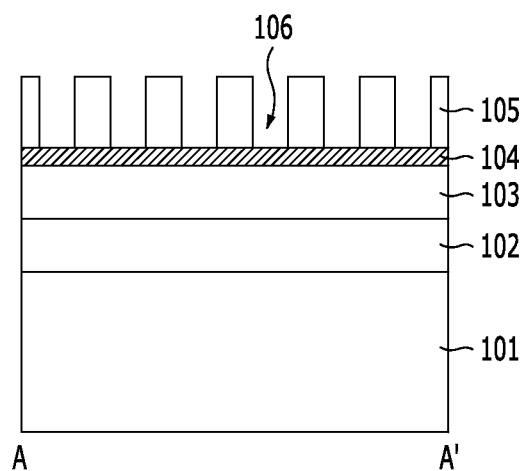
FIGS. 2A to 2H are exemplary cross-sectional views taken along the lines A-A' of FIGS. 1A to 1H.
Figure 3A:
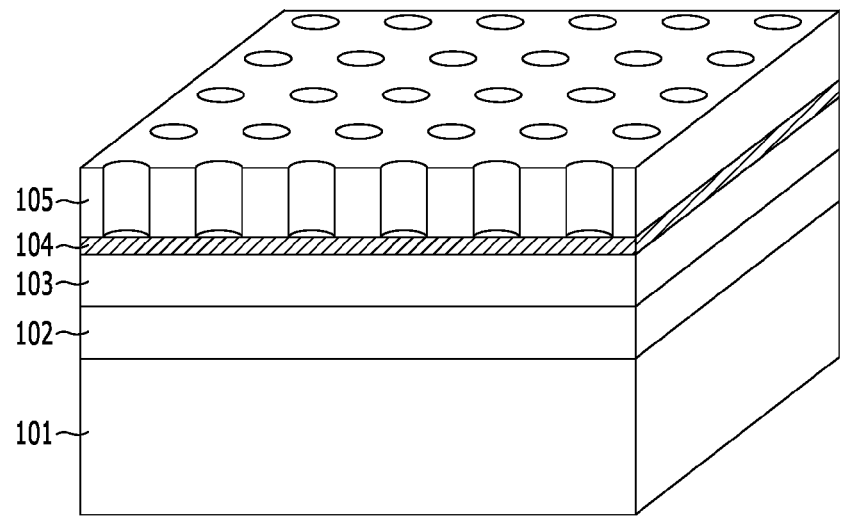
FIGS. 3A to 3H are exemplary perspective views explaining the method for fabricating a mask pattern.

Referring to FIGS. 1A, 2A and 3A, first and second hard mask layers 102 and 103 are stacked on a sacrificial layer 101. The sacrificial layer 101, in which hole patterns are to be formed, may include a substrate, a conductive layer and a dielectric layer. The sacrificial layer 101 may serve as an etch barrier for forming hole patterns with an asymmetrical arrangement in a subsequent process.

The first hard mask layer 102 is used to etch the sacrificial layer 101, and may include a material which has an etching selectivity with respect to the sacrificial layer 101. The first hard mask layer 102 may include a dielectric layer and may include a carbon layer. The carbon layer may include, for example, an amorphous carbon layer. The first hard mask layer 102 may be formed to have a thickness that may allow the first hard mask layer 102 to be used as the etch barrier of the sacrificial layer 101.

The second hard mask layer 103 is used to etch at least the first hard mask layer 102, and may include a material which has an etching selectivity with respect to the first hard mask layer 102. The second hard mask layer 103 may include the single layer structure of, for example, a polysilicon layer or a silicon oxynitride (SiON) layer. In other implementations, the second hard mask layer 103 may include the stack structure of a PETEOS (plasma enhanced tetraethylorthosilicate) layer and a silicon oxynitride layer. The second hard mask layer 103 may be formed to have a thickness that may allow the second hard mask layer 103 to be used as the etch barrier of the first hard mask layer 102.

An anti-reflective coating (ARC) 104 is formed on the second hard mask layer 103. The anti-reflective coating 104 provides anti-reflection during an optical exposure process for forming a photoresist pattern 105 and subsequent optical processing in a photolithography process.

For example, the first hard mask layer 102 may be formed to a have thickness of 1,000 Å to 1,500 Å, the second hard mask layer 103 may be formed to have a thickness of 200 Å to 500 Å, and the anti-reflective coating 104 may be formed to have a thickness of 200 Å to 300 Å. In various implementations, the thicknesses of the respective hard mask layers 102 and 103 and the anti-reflective coating 104 may be changed based on process conditions including the thickness of the sacrificial layer 101.

A photoresist pattern 105 with a plurality of openings 106 is formed on the anti-reflective coating 104. The photoresist pattern 105 may be patterned through coating, exposure and development of a photoresist on the anti-reflective coating 104, such that openings with uniform longitudinal and transverse intervals are defined. For example, where the hole patterns to be finally realized have the transverse interval of 180 nm and the longitudinal interval of 90 nm, the patterning through the photoresist pattern 105 can be performed such that both longitudinal and transverse intervals of hole patterns are the same as 90 nm. For example, the transverse interval and the longitudinal interval of hole patterns, which are to be realized through the photoresist pattern 105, are both 90 nm. That is to say, the hole patterns (the openings 106) may be patterned through the photoresist pattern 105 such that both longitudinal and transverse intervals thereof are the same as $S_1$.

Since the hole patterns are patterned to have uniform longitudinal and transverse intervals, the light introduced into the hole patterns act same in the longitudinal (vertical) direction and the transverse (horizontal) direction. Thus, non-uniformity caused by the hole patterns with asymmetrical arrangement can be improved.

Figure 1B:
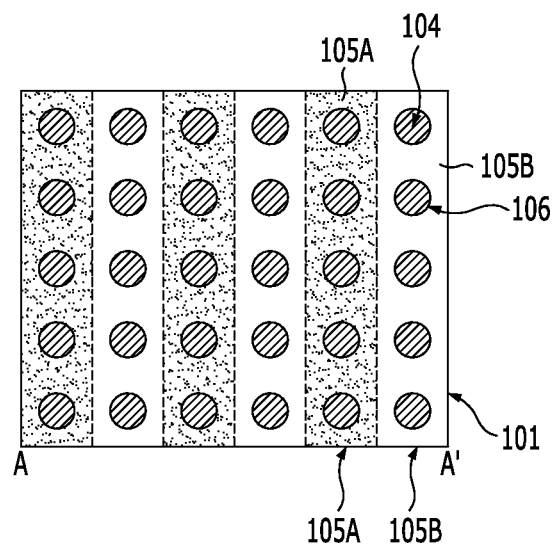
Figure 2B:
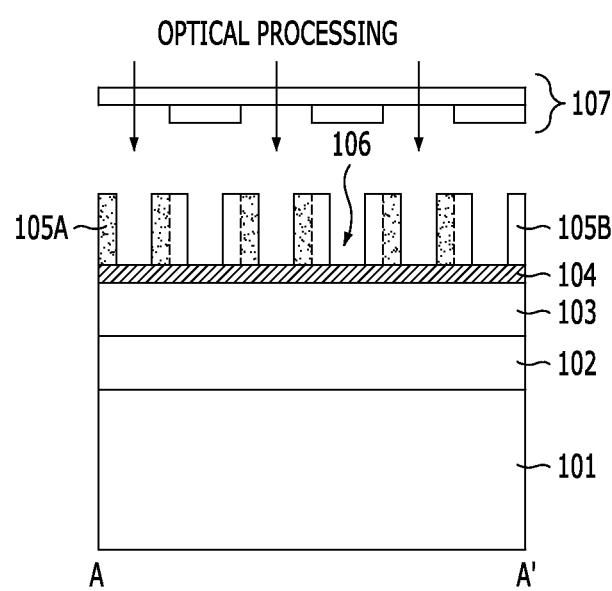
Figure 3B:
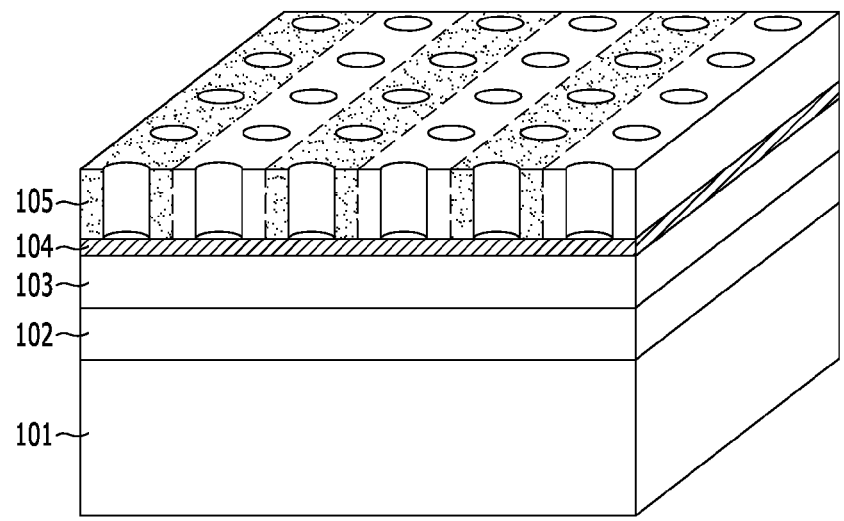

Referring to FIGS. 1B, 2B and 3B, optical processing is selectively performed for the photoresist pattern 105. The optical processing may be performed such that beams are irradiated to only selective regions of the photoresist pattern 105 by using a reticle 107. In other implementations, the optical processing may be performed using light or materials which cause links between a reaction layer that is provided in a subsequent process and the photoresist pattern 105 to be broken or modified. For example, the optical processing enables the end groups of a chemical formula to be broken or modified.

The reticle 107 may be formed by forming a material layer not transmitting light on the surface of a glass plate and then patterning the material layer to be able to selectively transmit light. For example, the reticle 107 may be patterned such that beams are not irradiated to regions of the photoresist pattern 105 where hole patterns are not to be formed, and beams are selectively irradiated to regions of the photoresist pattern 105 where hole patterns are to be formed. Since in the reasons where hole patterns are not to be formed, any reactions to form a link between the photoresist pattern 105 and a reaction layer are not required, the reticle 107 can be designed such that beams are not irradiated to those reasons. For instance, in the case of forming hole patterns with an asymmetrical arrangement with different longitudinal and transverse intervals, the reticle 107 may include a line type material layer which extends in the longitudinal direction or the transverse direction.

The photoresist pattern 105 for which the optical processing is selectively performed by the reticle 107 may include first regions 105A where optical processing is performed and second regions 105B where optical processing is not performed. Since the optical processing is performed in the first regions, any links between the photoresist pattern 105 and the reaction layer to be broken and coupling is not provided. Since the optical processing is not performed in the second regions 105Bta chemical formula is not changed and thus the links between the photoresist pattern 105 and the reaction layer remain.

In order to provide hole patterns of an asymmetrical arrangement with different longitudinal and transverse intervals, the first regions 105A and the second regions 105B may be alternately formed. The first regions 105A and the second regions 105B may be formed to have a line typed shape as the shape of the reticle 107 is transferred to the photoresist pattern 105. In the present implementation, holes patterns of an asymmetrical arrangement have the transverse interval of the hole patterns greater than the longitudinal interval of the hole patterns. In other configurations, various changes can be made for the asymmetrical arrangement of the hole patterns.

FIG. 2B shows the transverse plane taken along the line A-A'. As the reticle 107 is patterned such that portions of a material layer are separated from one another by a predetermined distance on a glass plate, the photoresist pattern 105 may be alternately formed to include the first regions 105A and the second regions 105B. In other words, the optical processing may be performed such that the sidewall of the first regions 105A and the sidewall of the second regions 105B are arranged so that each adjacent openings is defined by either sidewalls of first regions 105A or sidewalls of second regions 105B. For example, as illustrated in the specific example in FIG. 2B, the first left opening 106 is defined by sidewalls of the first regions 105A, the second left opening 106 is defined by sidewalls of the second regions 105B, the third left opening is defined by sidewalls of the first regions 105A, and the fourth left opening is defined by sidewalls of the second regions 105B, and so on.

Figure 1C:
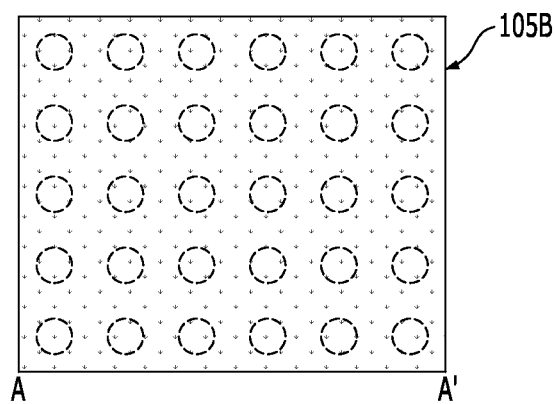
Figure 2C:
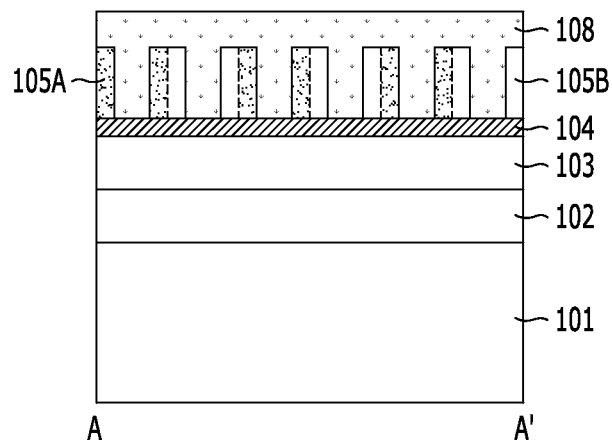
Figure 3C:
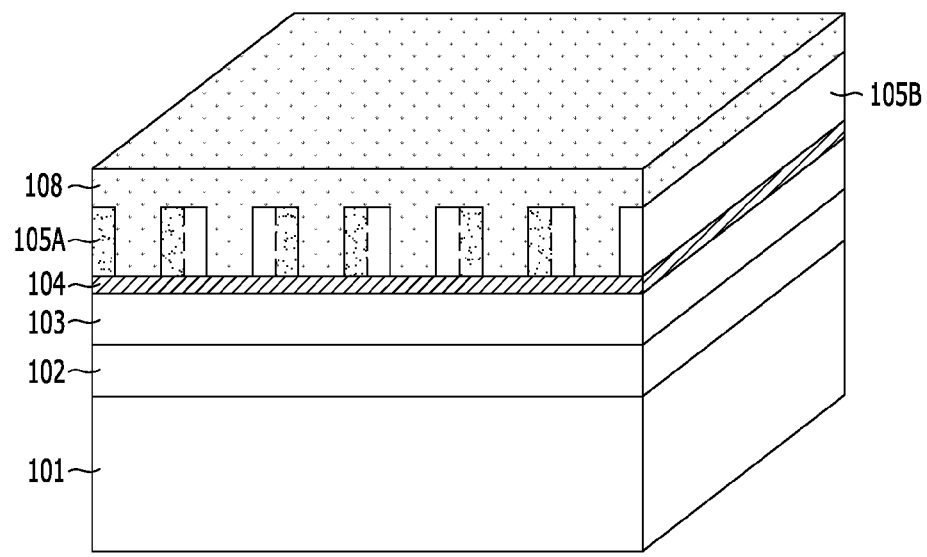

Referring to FIGS. 1C, 2C and 3C, a reaction layer 108 is formed to fill or cover the openings 106. The reaction layer 108 is used to fill or cover only some openings 106. For example, the openings 106 defined by the second regions 105B are filled or covered through a linking reaction with the photoresist pattern 105.

The reaction layer 108 may include a material which may be linked with the photoresist pattern 105. The reaction layer 108 may include, for example, a cross-linking material layer. The reaction layer 108 may include, for example, a RELACS (resist enhancement lithography assisted by chemical shrink) layer. The reaction layer 108 may be formed using a spin-on method.

The reaction layer 108 may be formed to have a thickness greater than the height of the photoresist pattern 105 such that the openings 106 can be sufficiently buried.

Figure 1D:
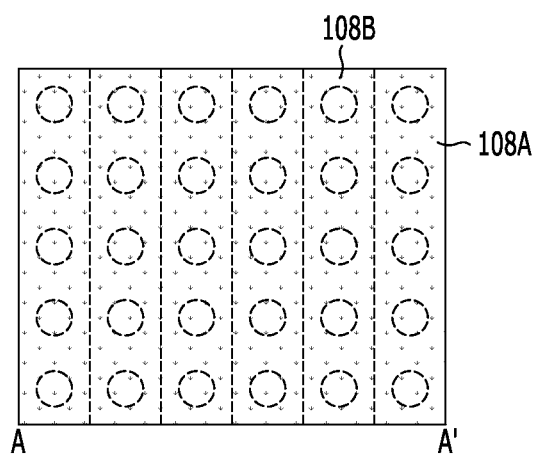
Figure 2D:
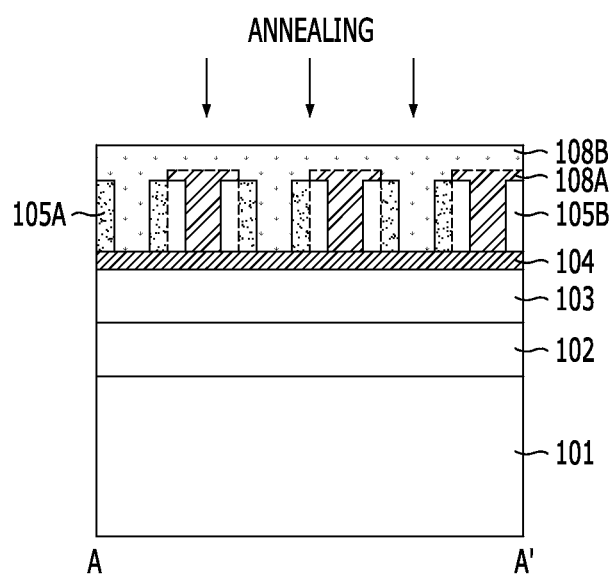
Figure 3D:
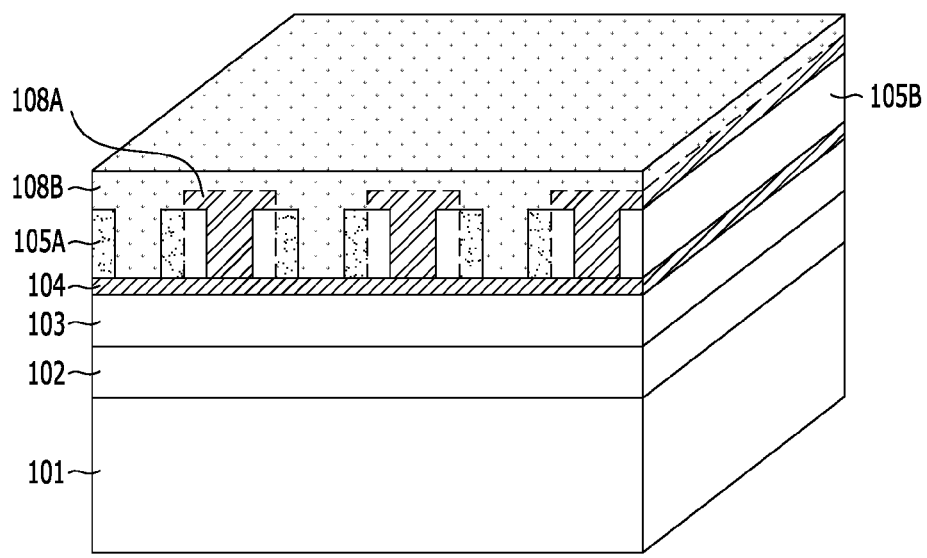

Referring to FIGS. 1D, 2D and 3D, by linking the second regions 105B of the photoresist pattern 105 with the reaction layer 108, a cross-linked layer 108A may be formed. In order to form the cross-linked layer 108A, annealing may be performed. The annealing may be performed under a condition for expediting the reaction between the second regions 105B and the reaction layer 108.

For example, the annealing may be performed under a condition that the second regions 105B of the photoresist pattern 105 and the reaction layer 108 are fully linked and that the reaction layer 108 buried in the openings 106 is fully changed to the cross-linked layer 108A.

In this way, the second regions 105B of the photoresist pattern 105 reacts with the reaction layer 108 through the annealing and forms the cross-linked layer 108A. Since the first regions 105A of the photoresist pattern does not react with the reaction layer, any links between the first regions 105A and the reaction layer 108 are not provided. Thus, the reaction layer 108 which fills or covers the openings 106 defined by the first regions 105A remains without any material change. Hereinafter, the remaining reaction layer 108 without undergoing any material change will be referred to as a 'residual reaction layer 108B'.

As illustrated in a specific example of FIG. 2D showing the transverse plane taken along the line A-A', the residual reaction layer 108B and the cross-linked layer 108A are alternately formed in the openings 106.

Figure 1E:
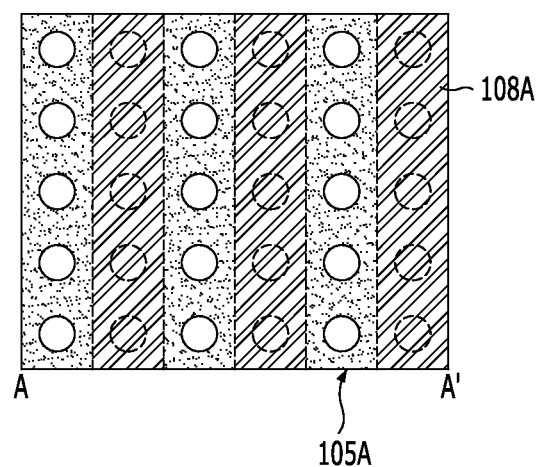
Figure 2E:
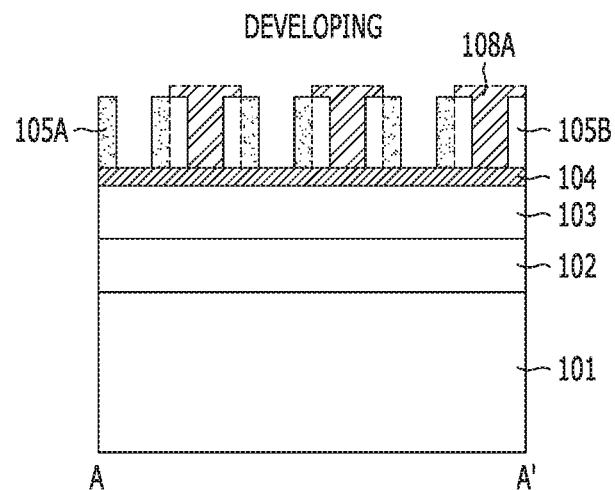
Figure 3E:
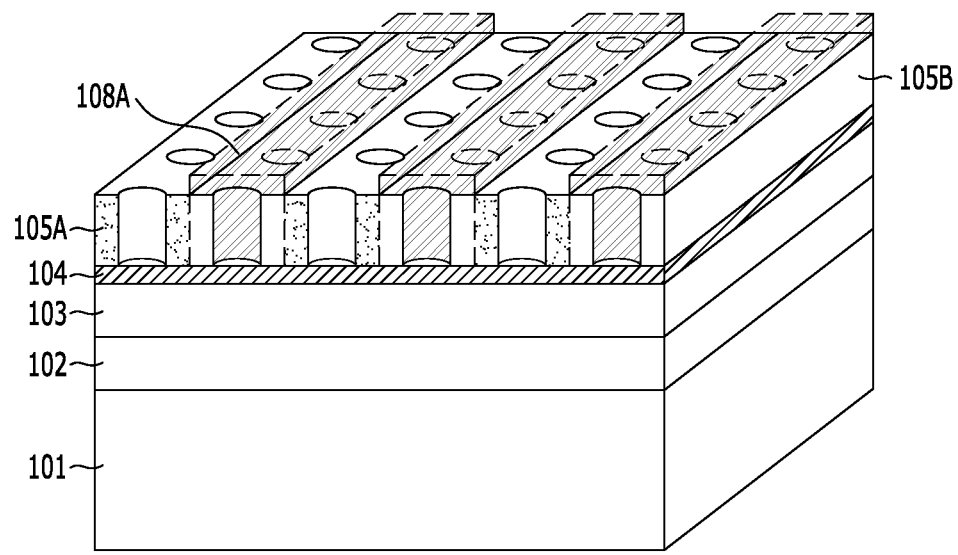

Referring to FIGS. 1E, 2E and 3E, the residual reaction layer 108B without the links with the photoresist pattern 105 is removed. The residual reaction layer 108B without the cross-link may be developed using triple-distilled water (ultra pure water or deionized water).

Thus, in the openings 106 defined by the first regions 105A, the original hole patterns of the photoresist pattern 105 may be exposed without any change. The openings 106 defined by the second regions 105B may be fully filled or covered by the cross-linked layer 108A. Hereinafter, the cross-linked layer 108A filled or covered in the openings 106 will be referred to as a 'gap filling layer 108A'.

Figure 1F:
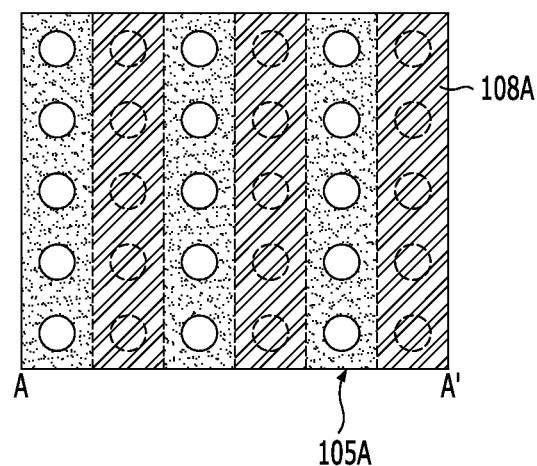
Figure 2F:
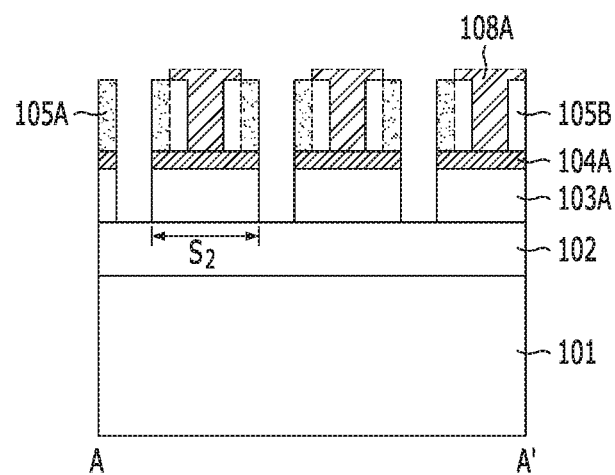
Figure 3F:
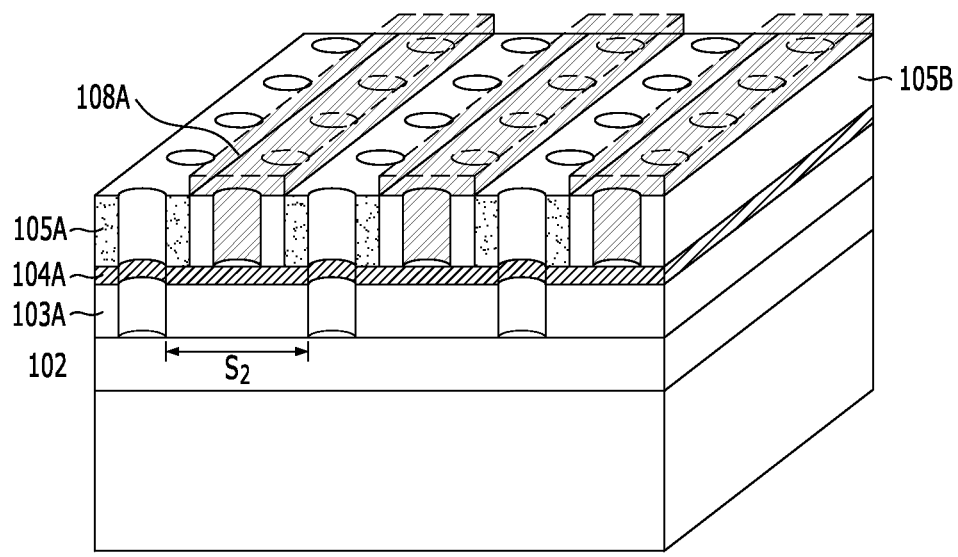

Referring to FIGS. 1F, 2F and 3F, the anti-reflective coating 104 and the second hard mask layer 103 are etched by using the first regions 105A of the photoresist pattern 105 and the gap filling layer 108A as an etch barrier. The anti-reflective coating 104 may be etched to form an anti-reflective pattern 104A, and the second hard mask layer 103 may be etched to form a second hard mask pattern 103A.

Since the optical processing is not performed in the second regions 105B, the openings 106 defined by the second regions 105B are fully filled or covered by the gap filling layer 108A. Therefore, the shapes of the openings 106 defined by only the first regions 105A are transferred to the underlying layer, i.e., the second hard mask pattern 103A. Consequently, a transverse interval $S_2$ of the openings 106 defined by the second hard mask pattern 103A may be greater than the interval $S_1$ of FIG. IA.

Figure 1G:
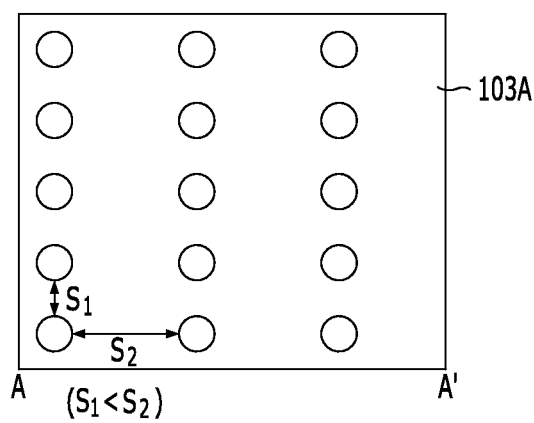
Figure 2G:
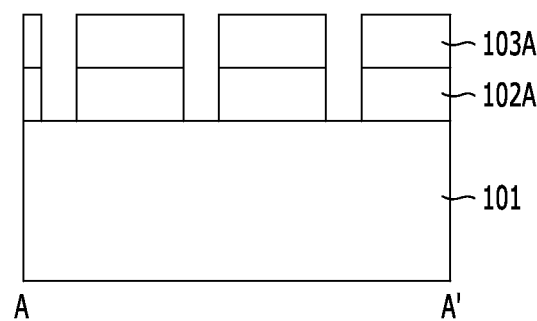
Figure 3G:
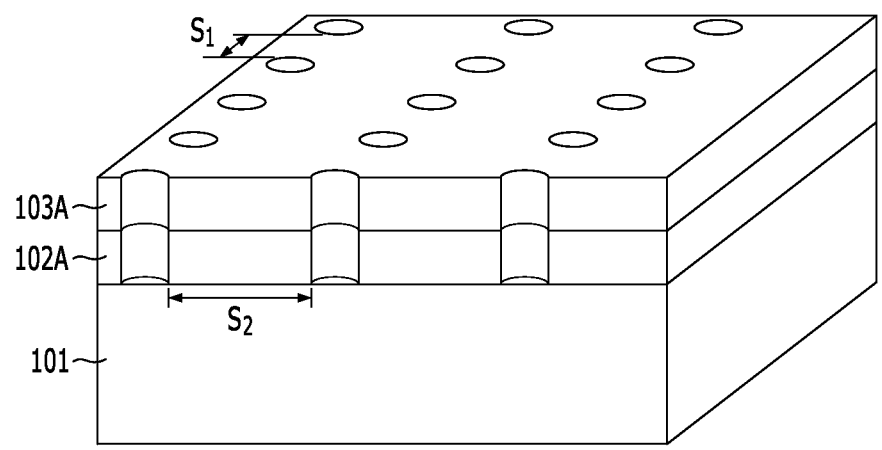

Referring to FIGS. 1G, 2G and 3G, the photoresist pattern 105A and 105B and the gap filling layer 108A are removed. When removing the photoresist pattern 105A and 105B, the anti-reflective pattern 104A may be removed together.

By etching the first hard mask layer 102 using the second hard mask pattern 103A as an etch barrier, a first hard mask pattern 102A is formed. The etched second hard mask pattern 103A may be transferred to the first hard mask layer 102 so that the first hard mask pattern 102A has the same shape of the second hard mask pattern 103A.

Consequently, the openings 106 defined by the first and second hard mask patterns 102A and 103A have an asymmetrical arrangement with the transverse interval $S_2$ greater than the longitudinal interval $S_1$.

Figure 1H:
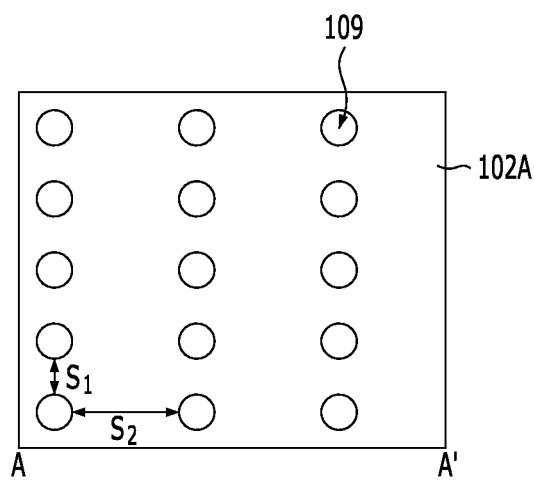
Figure 2H:
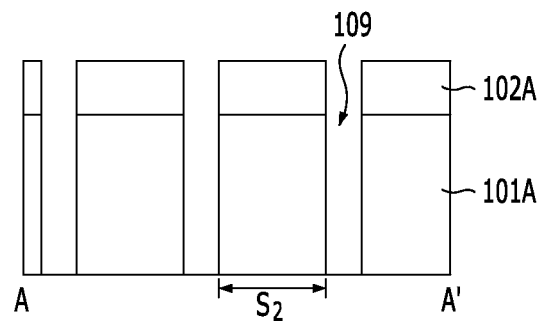
Figure 3H:
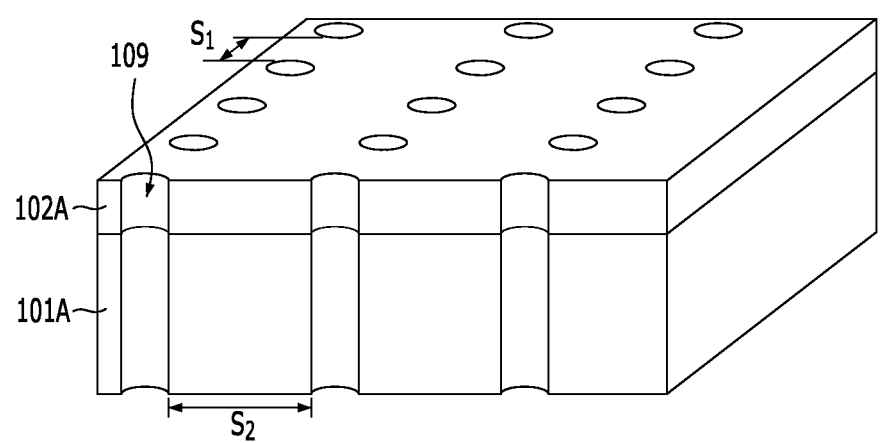

Referring to FIGS. 1H, 2H and 3H, by etching the sacrificial layer 101 using the first hard mask pattern 102A as an etch barrier, a sacrificial pattern 101A may be formed to have hole patterns 109 of an asymmetrical arrangement with different transverse and longitudinal intervals.

The second hard mask pattern 103A may be removed through a removal process when the hole patterns 109 are formed or before the hole patterns 109 are formed.

Accordingly, the sacrificial pattern 101A may be formed to have the hole patterns 109 of an asymmetrical arrangement with the different longitudinal interval $S_1$ and transverse intervals $S_2$.

In the present implementation of the disclosed technology, by forming a photoresist pattern having openings with uniform longitudinal and transverse intervals and then performing selective optical processing using material change for preventing a coupling reaction between a reaction layer and some of the photoresist pattern, it is possible to form hole patterns of an asymmetrical arrangement with different longitudinal and transverse intervals. In particular, in the present implementation, the light does not act differently in longitudinal and transverse directions although the hole patterns to be finally realized have an asymmetrical arrangement with the different longitudinal and transverse intervals. Thus, non-uniformity of hole patterns due to non-uniformity of the effects of light can be improved, thereby increasing the yield of an electronic device may be increased.

As one example, in the present implementation, an asymmetrical arrangement of the hole patterns provides the transverse interval of the hole patterns greater than the longitudinal interval of the hole patterns. In other configurations, various changes can be made for the asymmetrical arrangement of the hole patterns.

FIGS. 4A to 4I are exemplary plan views explaining a method for fabricating a mask pattern in accordance with an implementation of this patent document. FIGS. 5A to 5I are exemplary cross-sectional views taken along the lines A-A' of FIGS. 4A to 4I.

Figure 4A:
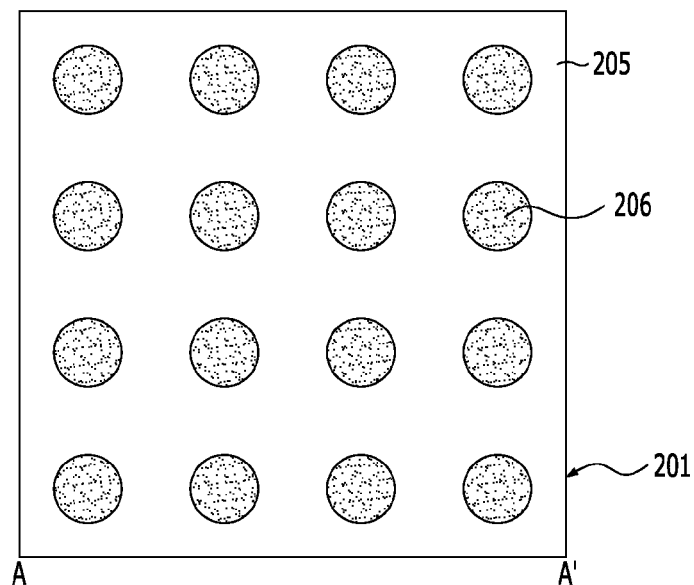
FIGS. 4A to 4I are exemplary plan views explaining a method for fabricating a mask pattern.
Figure 5A:
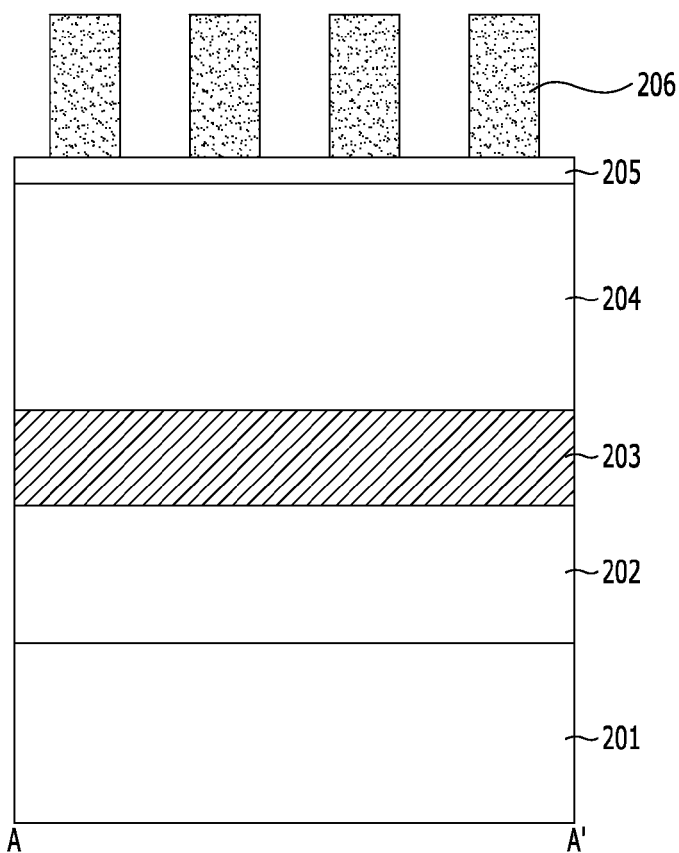
FIGS. 5A to 5I are exemplary cross-sectional views taken along the lines A-A' of FIGS. 4A to 4I.

Referring to FIGS. 4A and 5A, first, second and third hard mask layers 202, 203 and 204 are stacked on a sacrificial layer 201. The sacrificial layer 201, in which hole patterns are to be formed, and may include a substrate, a conductive layer and a dielectric layer. The sacrificial layer 201 may serve as an etch barrier for forming hole patterns of an asymmetrical arrangement in a subsequent process.

The first hard mask layer 202 is used to etch the sacrificial layer 201, and may include a material which has an etching selectivity with respect to the sacrificial layer 201. The first hard mask layer 202 may include, for example, a polysilicon layer. The first hard mask layer 202 may be formed to have a thickness that may allow the first hard mask layer 202 to be used as the etch barrier of the sacrificial layer 201.

The second hard mask layer 203 is used to etch at least the first hard mask layer 202, and may include a material which has an etching selectivity with respect to the first hard mask layer 202. The second hard mask layer 203 may include a dielectric layer. The second hard mask layer 203 may include, for example, a nitride layer. The second hard mask layer 203 may be formed to have a thickness that may allow the second hard mask layer 203 to be used as the etch barrier of the first hard mask layer 202.

The third hard mask layer 204 is used to etch the second hard mask layer 203, and may include a material which has an etching selectivity with respect to the second hard mask layer 203. The third hard mask layer 204 may include, for example, a carbon layer. The carbon layer may include, for example, an amorphous carbon layer.

A fourth hard mask layer 205 is formed on the third hard mask layer 204. The fourth hard mask layer 205 may serve as the etch barrier of the third hard mask layer 204 and provide anti-reflection when forming a photoresist pattern in subsequent processes. The fourth hard mask layer 205 may prevent footing between the photoresist pattern and the third hard mask layer 204. The fourth hard mask layer 205 may include an inorganic dielectric layer. The fourth hard mask layer 205 may include, for example, a silicon oxynitride (SiON) layer.

For example, if the sacrificial layer 201 is formed to have a thickness of 1,000 Å to 4,000 Å, the first hard mask layer 202 may be formed to have a thickness of 900 Å to 2,000 Å, the second hard mask layer 203 may be formed to have a thickness of 200 Å to 900 Å, the third hard mask layer 204 may be formed to have a thickness of 2,000 Å to 4,000 Å, and the fourth hard mask layer 205 may be formed to have a thickness of 200 Å to 500 Å. In various implementations, the thicknesses of the respective hard mask layers 202, 203, 204 and 205 may be changed according to process conditions including the thickness of the sacrificial layer 201.

First photoresist patterns 206 are formed on the fourth hard mask layer 205. Before forming the first photoresist patterns 206, an anti-reflective coating may be additionally formed on the fourth hard mask layer 205.

The first photoresist patterns 206 may be patterned to define openings with uniform longitudinal and transverse intervals through performing coating, exposure and development processes for a photoresist on an anti-reflective coating. For example, where the hole patterns to be finally realized to have the transverse interval of 180 nm and the longitudinal interval of 90 nm, the patterning of the pillar typed first photoresist patterns 206 may be performed to provide the transverse interval of 90 nm and the longitudinal interval of 90 nm. That is to say, the pillar typed first photoresist patterns 206 may be patterned such that both longitudinal and transverse intervals thereof are the same.

Figure 4B:
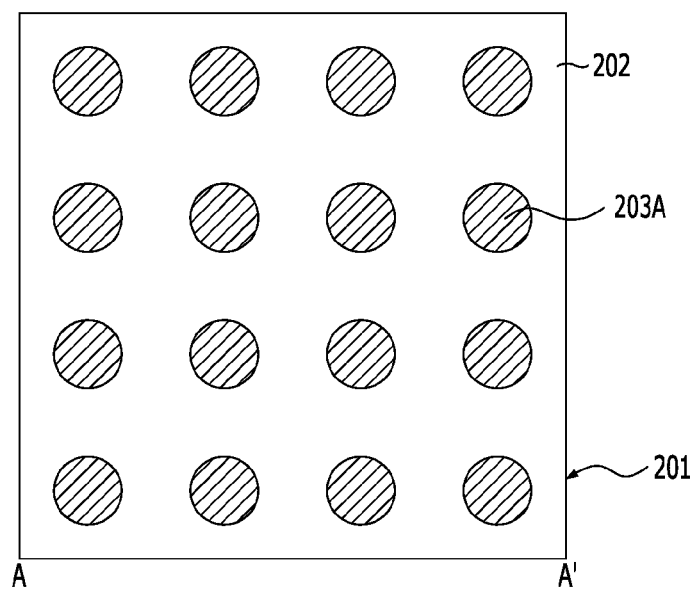
Figure 5B:
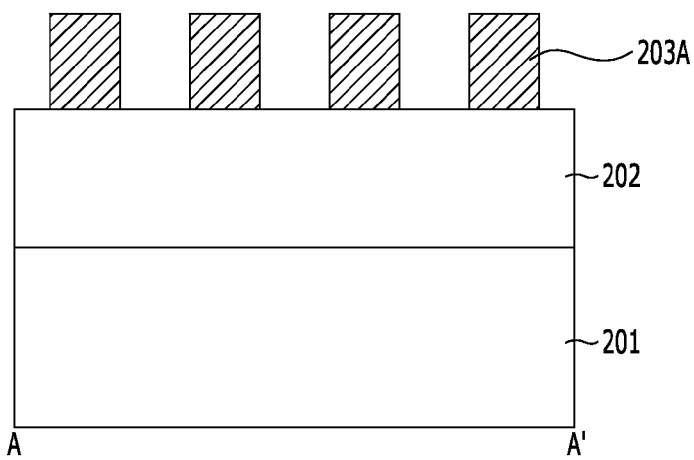

Referring to FIGS. 4B and 5B, the fourth hard mask layer 205 and the third hard mask layer 204 are etched using the first photoresist patterns 206 as etch barriers.

By etching the second hard mask layer 203 using the etched third and fourth hard mask layers 204 and 205 as etch barriers, pillar typed second hard mask patterns 203A are formed.

Then, the third and fourth hard mask layers 204 and 205 are removed. At this time, the first photoresist patterns 206 may be removed together.

Figure 4C:
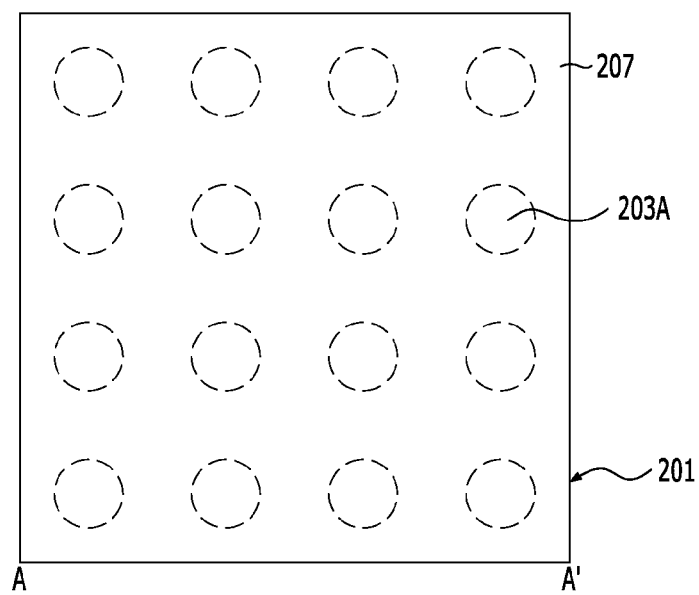
Figure 5C:
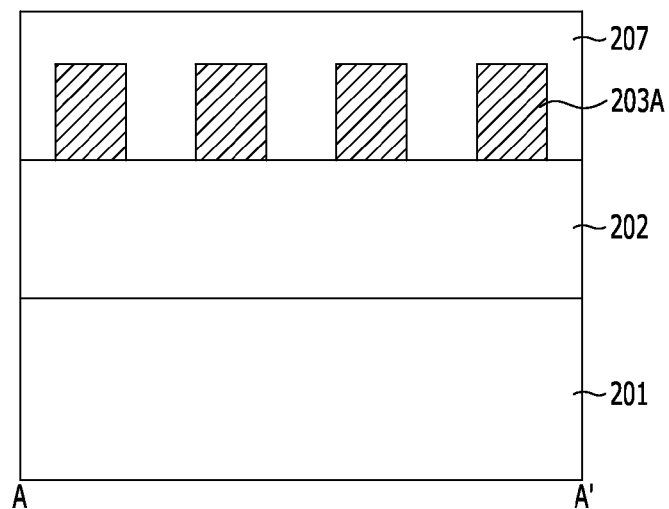

Referring to FIGS. 4C and 5C, a gap filling layer 207 is formed to fill or cover the spaces between the second hard mask patterns 203A. The gap filling layer 207 may serve as an etch barrier for forming hole patterns in a subsequent process. The gap filling layer 207 may include a material which has an etching selectivity with respect to the first hard mask layer 202. The gap filling layer 207 may be formed to have a thickness greater than that of the second hard mask patterns 203A such that the second hard mask patterns 203A are sufficiently buried. The gap filling layer 207 may include a dielectric layer with good flowability. For example, the gap filling layer 207 may include a polymer layer.

Figure 4D:
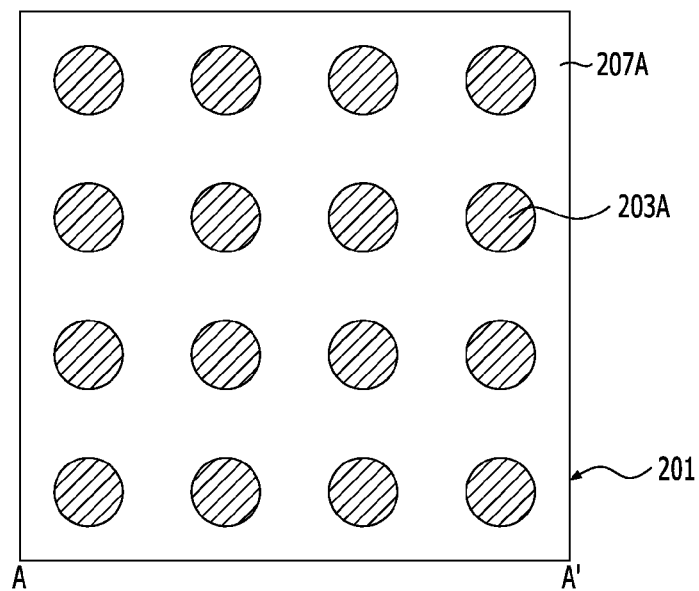
Figure 5D:
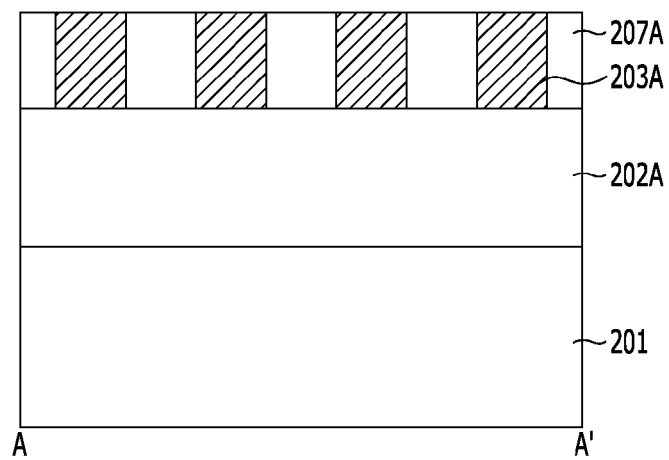

Referring to FIGS. 4D and 5D, the gap filling layer 207 is etched to expose the surfaces of the second hard mask patterns 203A. Accordingly, the second hard mask patterns 203A and the gap filling pattern 207A are alternately repeated, and the gap filling pattern 207A fully fills or covers the spaces between the second hard mask patterns 203A.

An etching process for forming the gap filling pattern 207A may be performed as a blanket etching (for example, etch-back) process or a polishing process. The polishing process may include, for example, a chemical mechanical polishing (CMP) process.

Figure 4E:
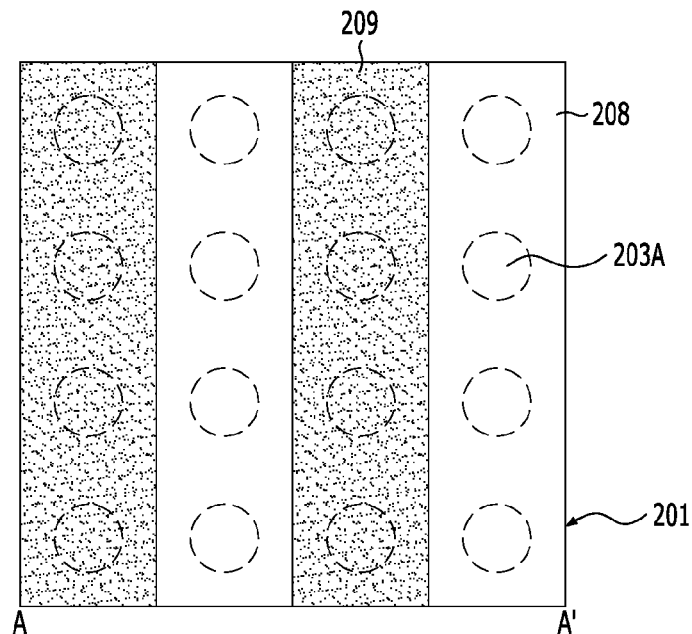
Figure 5E:
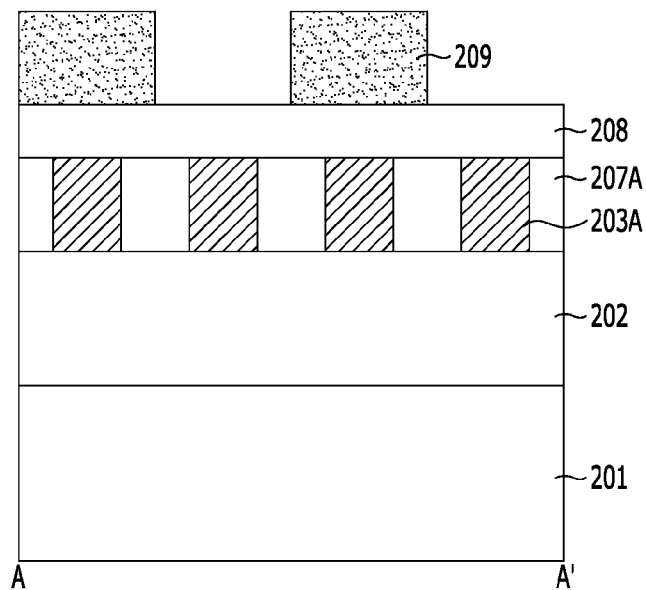

Referring to FIGS. 4E and 5E, a fifth hard mask layer 208 is formed on the second hard mask patterns 203A and the gap filling pattern 207A. The fifth hard mask layer 208 is used to selectively expose only predetermined hole patterns, and may include a material which has an etching selectivity with respect to the second hard mask patterns 203A and the gap filling pattern 207A. The fifth hard mask layer 208 may include, for example, a polysilicon layer.

Second photoresist patterns 209 are formed on the fifth hard mask layer 208. Before forming the second photoresist patterns 209, an anti-reflective coating may be additionally formed on the fifth hard mask layer 208. The second photoresist patterns 209 may be patterned through coating, exposure and development processes of a photoresist on an anti-reflective coating, into a line typed shape in which lines and spaces are alternately repeated.

The lines and spaces of the second photoresist patterns 209 may be patterned such that regions where the fifth hard mask patterns 208 are exposed and regions where the fifth hard mask patterns 208 are not exposed are alternately arranged.

Figure 4F:
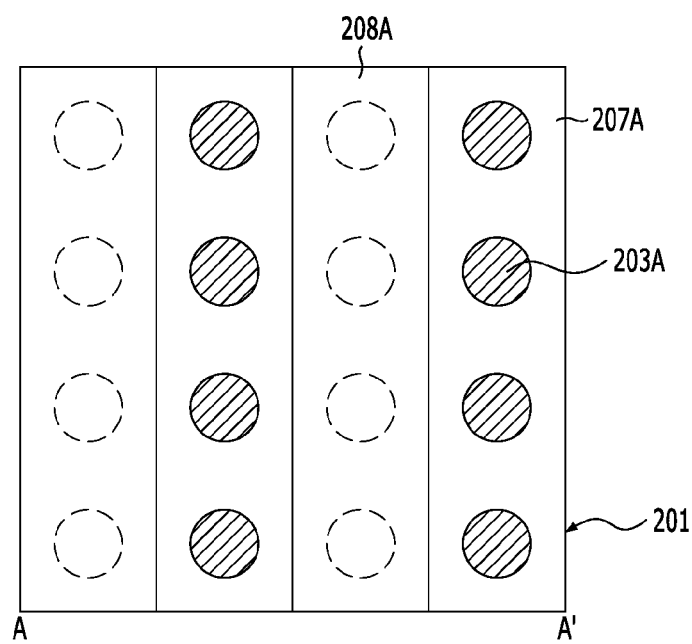
Figure 5F:
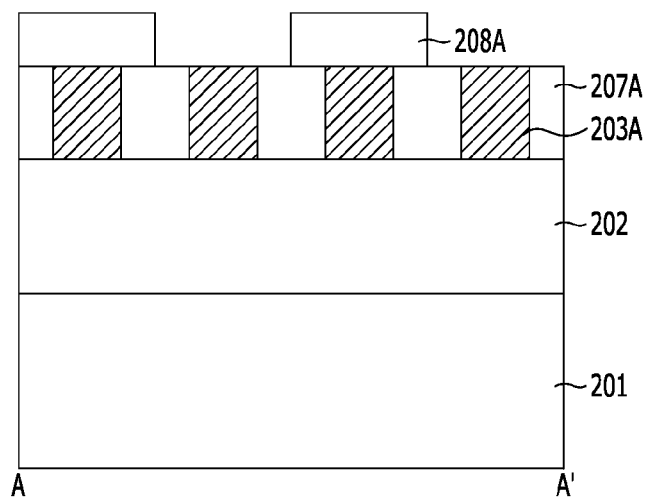

Referring to FIGS. 4F and 5F, the fifth hard mask layer 208 is etched using the second photoresist patterns 209 as etch barriers. The fifth hard mask layer 208 is etched to form fifth hard mask patterns 208A.

The fifth hard mask patterns 208A are also patterned into a line typed shape in such a manner that the second hard mask patterns 203A are alternately exposed in the transverse direction. For example, as illustrated in the specific example of FIG. 5F, the fifth hard mask patterns 208A include exposed regions where the pillar typed mask patterns 203A are exposed and non-exposed regions where the pillar typed mask patterns 203A are not exposed, and the exposed regions and the non-exposed regions are alternately arranged.

The second photoresist patterns 209 are removed. The second photoresist pattern 209 may be removed through dry etching. For example, the dry etching may include an oxygen strip process.

Figure 4G:
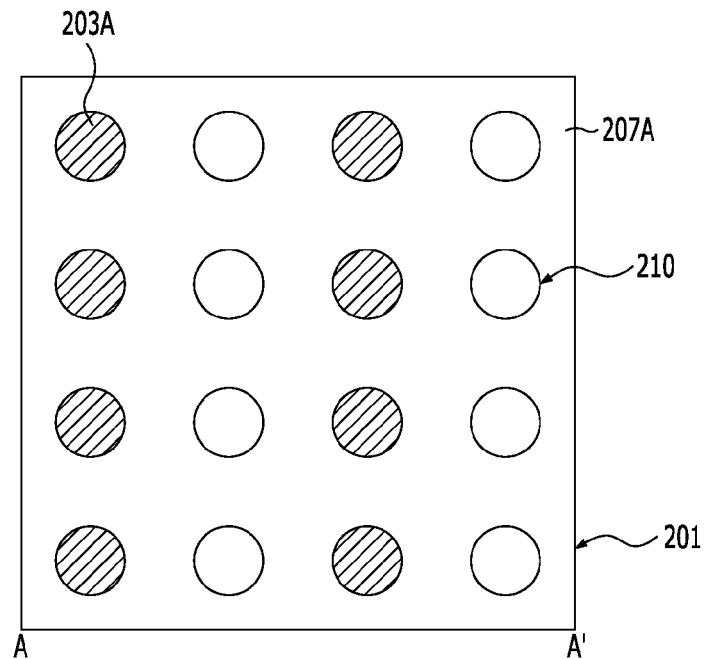
Figure 5G:
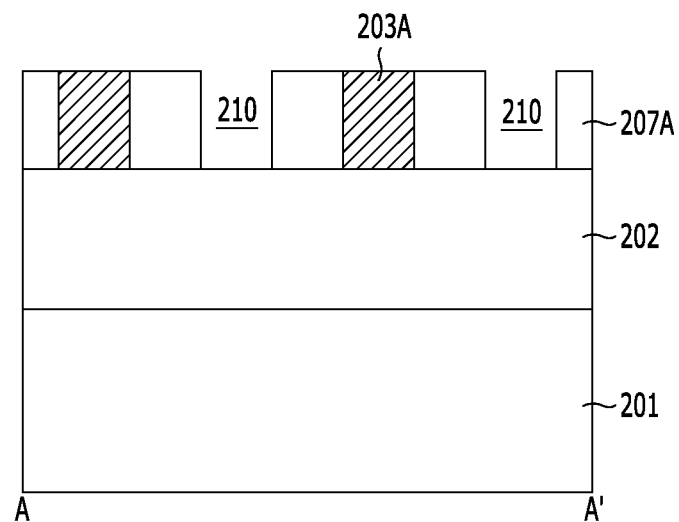

Referring to FIGS. 4G and 5G, by removing the second hard mask patterns 203A which are exposed by the fifth hard mask patterns 208A, hole patterns 210 are formed.

Then, the fifth hard mask patterns 208A are removed.

Accordingly, the pillar typed second hard mask patterns 203A and the hole patterns 210 are alternately repeated. An underlying layer, i.e., the first hard mask layer 202 may be exposed by the hole patterns 210. While the interval of the hole patterns 210 in the longitudinal direction remains the same, the hope patterns 210 and the second hard mask patterns 203A are alternately arranged in the transverse direction. Thus, the hole patterns 210 may have a transverse interval greater than a longitudinal interval.

Figure 4H:
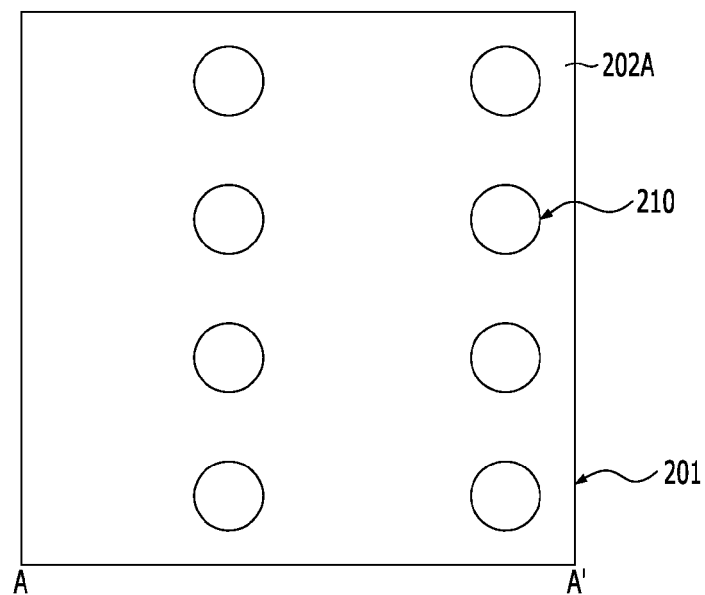
Figure 5H:
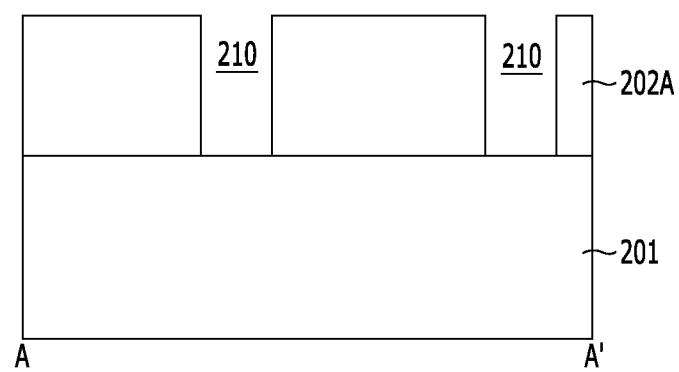

Referring to FIGS. 4H and 5H, by etching the first hard mask layer 202 using the second hard mask patterns 203A and the gap filling pattern 207A as etch barriers, hole patterns 210 are formed. The etched first hard mask layer 202 is shown as a first hard mask pattern 202A. The hole patterns 210 of FIGS. 4G and 5G may be transferred to the first hard mask layer 202.

Accordingly, the hole patterns 210 have an asymmetrical arrangement with the transverse interval greater than the longitudinal interval.

Figure 4I:
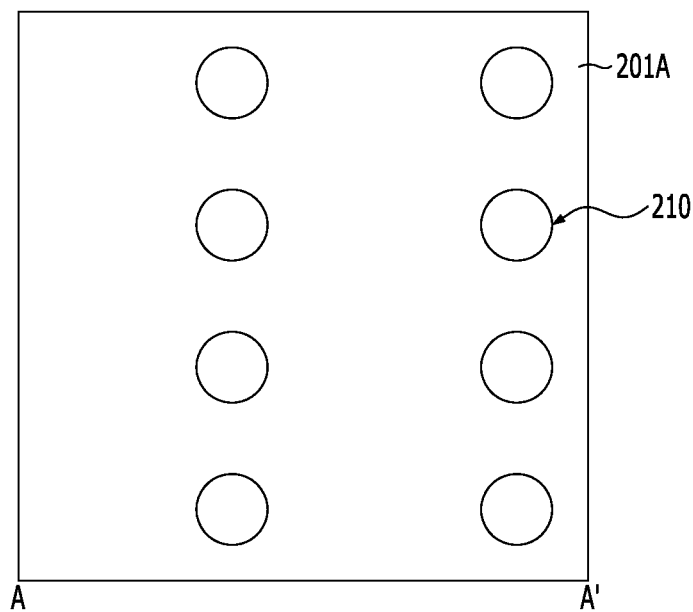
Figure 5I:
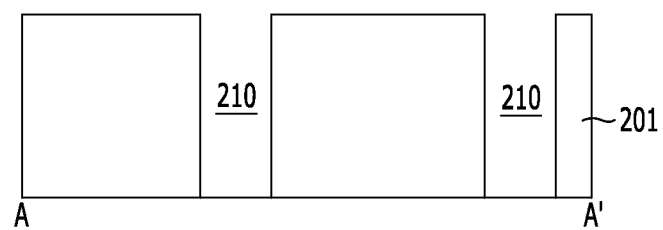

Referring to FIGS. 4I and 5I, by etching the sacrificial layer 201 using the first hard mask pattern 202A as an etch barrier, a sacrificial pattern is formed to define the hole patterns 210 of the asymmetrical arrangement with the different transverse and longitudinal intervals. The hole patterns 210 of FIGS. 4H and 5H may be transferred to the sacrificial layer 201.

The first hard mask pattern 202A may be removed through a removal process when the hole patterns 210 are formed or after the hole patterns 210 are formed.

Accordingly, the sacrificial pattern 201A is formed to define the hole patterns 210 of an asymmetrical arrangement with the different longitudinal and transverse intervals.

In the present implementation, by forming pillar typed hard mask patterns with uniform longitudinal and transverse intervals, filling a gap filling layer, and then selectively removing the hard mask patterns using line typed masks, it is possible to form hole patterns of an asymmetrical arrangement with different longitudinal and transverse intervals.

As one example, in the present implementation, the processes of forming a pillar structure, filling or covering the gap filling layer, and removing the pillar structures are performed. By using a pillar structure instead of a hole structure, non-uniformity of hole patterns caused from etching holes or non-uniformity due to the effects of light may be improved gap filling, thereby enabling a stable performance of an electronic device.

As one example, in the present implementation, an asymmetrical arrangement of the hole patterns provides the transverse interval of the hole patterns greater than the longitudinal interval of the hole patterns. In other configurations, various changes can be made for the asymmetrical arrangement of the hole patterns.

FIGS. 6A to 6L are exemplary plan views explaining a method for fabricating a mask pattern in accordance with an implementation of this patent document. FIGS. 7A to 7L are exemplary cross-sectional views taken along the lines A-A' of FIGS. 6A to 6L.

Figure 6A:
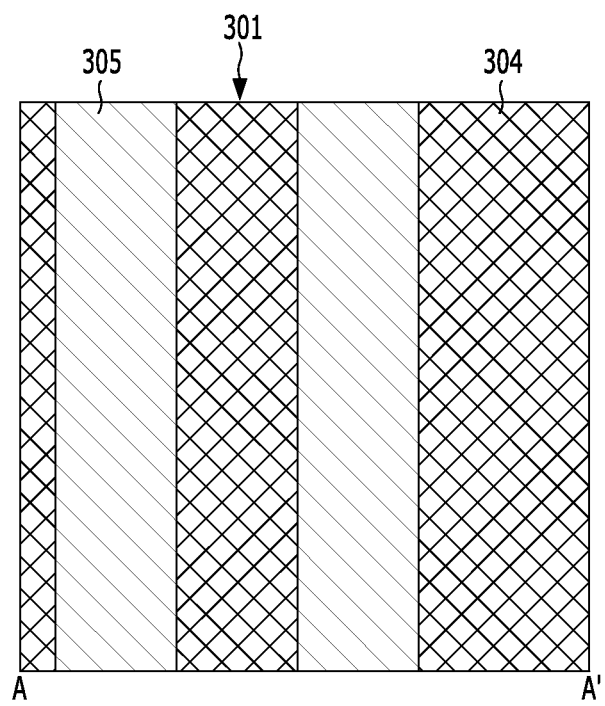
FIGS. 6A to 6L are exemplary plan views explaining a method for fabricating a mask pattern.
Figure 7A:
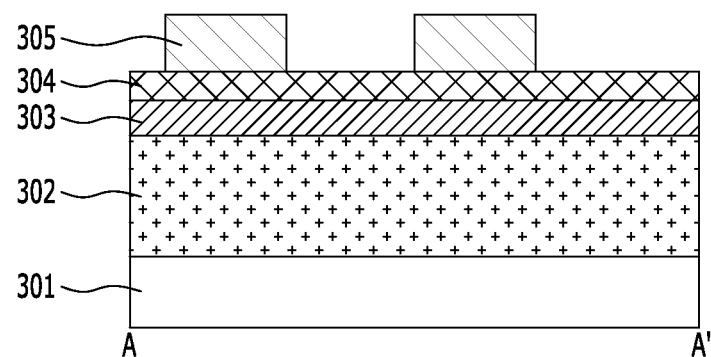
FIGS. 7A to 7L are exemplary cross-sectional views taken along the lines A-A' of FIGS. 6A to 6L.

Referring to FIGS. 6A and 7A, first and second hard mask layers 302 and 303 are stacked on a sacrificial layer 301. The sacrificial layer 301, in which hole patterns are to be formed, may include a substrate, a conductive layer and a dielectric layer. The sacrificial layer 301 may serve as an etch barrier for forming hole patterns of an asymmetrical arrangement in a subsequent process.

The first hard mask layer 302 is used to etch the sacrificial layer 301, and may include a material which has an etching selectivity with respect to the sacrificial layer 301. The first hard mask layer 302 may include, for example, a carbon layer. For example, the carbon layer may include an amorphous carbon layer. The first hard mask layer 302 may be formed to have a thickness that may allow the first hard mask layer 302 to be used as the etch barrier of the sacrificial layer 301.

The second hard mask layer 303 is used to etch at least the first hard mask layer 302, and may include a material which has an etching selectivity with respect to the first hard mask layer 302. The second hard mask layer 303 may include, for example, a polysilicon layer or a silicon oxynitride layer. In other implementations, the second hard mask layer 303 may include the stack structure of a PETEOS (plasma enhanced tetraethylorthosilicate) layer and a silicon oxynitride layer.

A neutral material layer 304 is formed on the second hard mask layer 303. The neutral material layer 304 may include hydrophilic regions and hydrophobic regions, which are assembled by self-assembling of a copolymer provided in a subsequent process.

First photoresist patterns 305 are formed on the neutral material layer 304. The first photoresist patterns 305 are used to pattern the neutral material layer 304, and may be formed to have a line typed shape which extends along regions for asymmetrically forming holes.

Figure 6B:
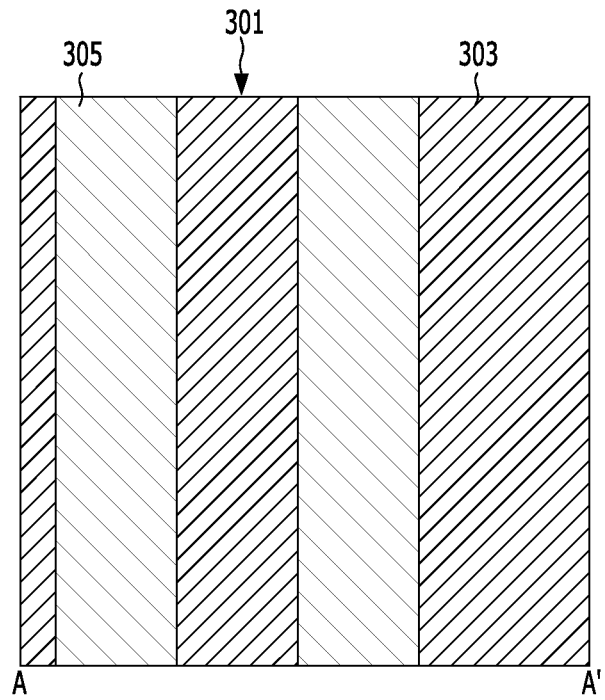
Figure 7B:
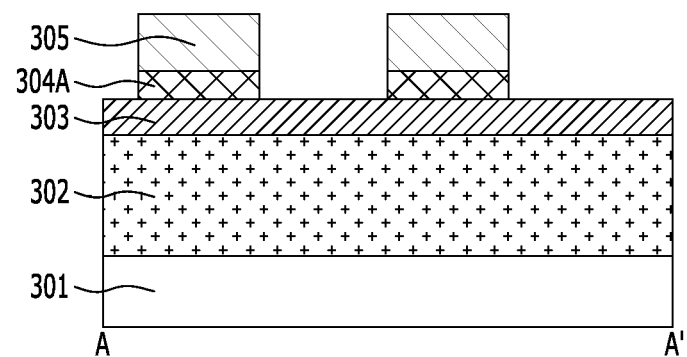

Referring to FIGS. 6B and 7B, the neutral material layer 304 is etched using the first photoresist patterns 305 as etch barriers. Hereinafter, the neutral material layer 304 patterned into a line typed shape like the first photoresist patterns 305 will be referred to as neutral material patterns 304A.

Figure 6C:
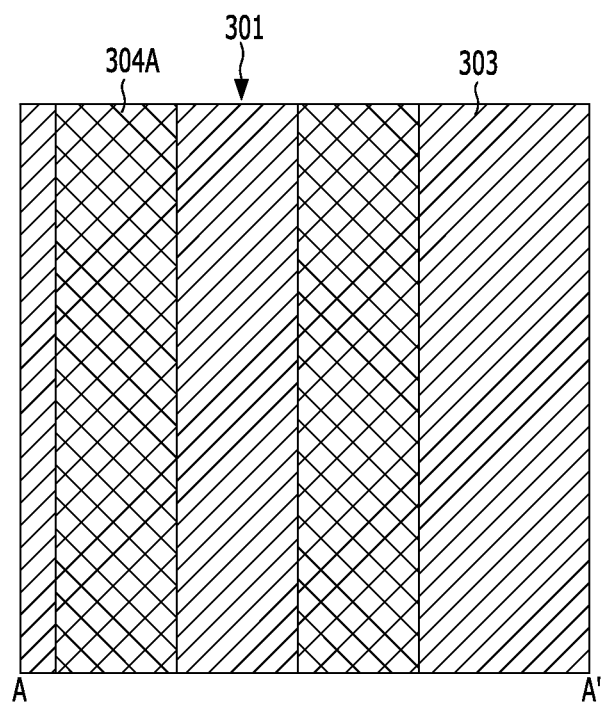
Figure 7C:
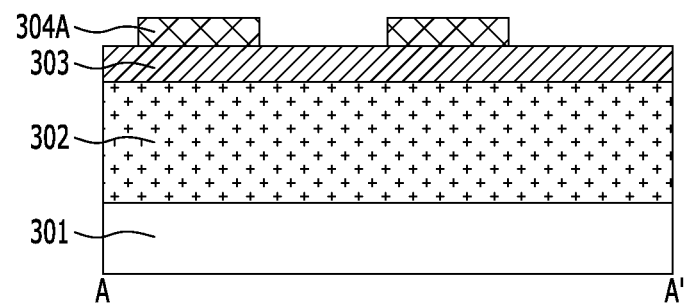

Referring to FIGS. 6C and 7C, the first photoresist patterns 305 are removed. The first photoresist patterns 305 may be removed through dry etching. The dry etching may be performed as, for example, an oxygen strip process.

Figure 6D:
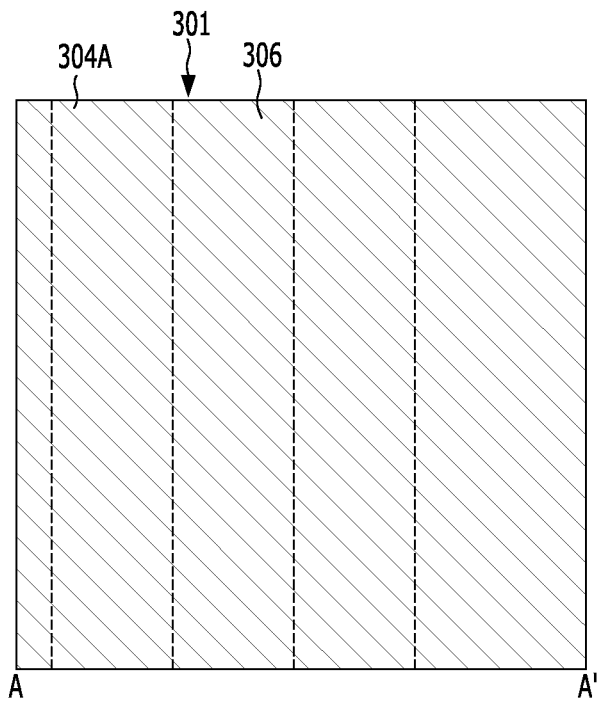
Figure 7D:
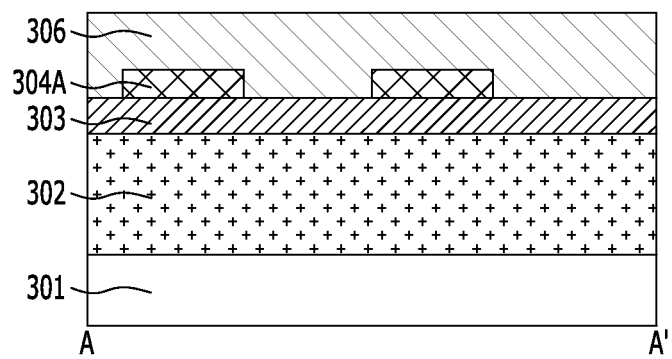

Referring to FIGS. 6D and 7D, a second photoresist 306 is coated on the neutral material patterns 304A and the second hard mask layer 303.

Figure 6E:
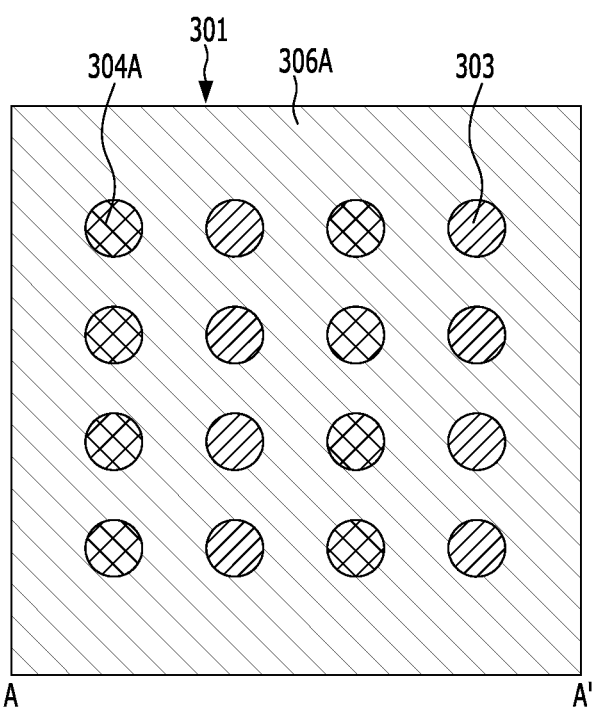
Figure 7E:
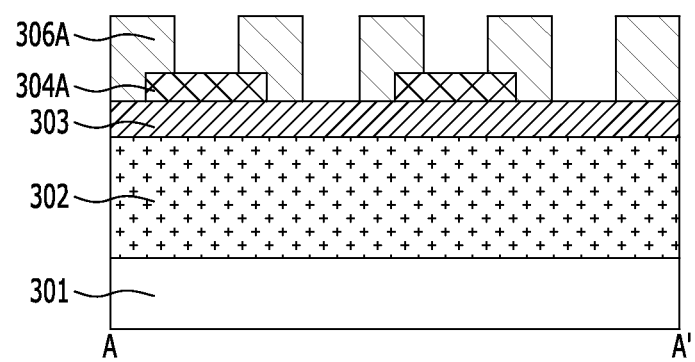

Referring to FIGS. 6E and 7E, a second photoresist pattern 306A which defines hole patterns with uniform longitudinal and transverse intervals is formed by patterning the second photoresist 306 through exposure and development processes. For example, where the hole patterns to be finally realized have the transverse interval of 180 nm and the longitudinal interval of 90 nm, the second photoresist pattern 306A may be formed such that hole patterns with both transverse and longitudinal intervals of 90 nm are defined. Further, in the present implementation, the hole patterns may be patterned to have a size greater than the size of contact holes to be defined, considering that the size of the hole patterns decreases due to sidewall spacers formed by a subsequent block copolymer.

The hole patterns defined by the second photoresist pattern 306A may be formed such that the regions where the neutral material patterns 304A are exposed and the regions where the second hard mask layer 303 is exposed are alternately repeated.

Figure 6F:
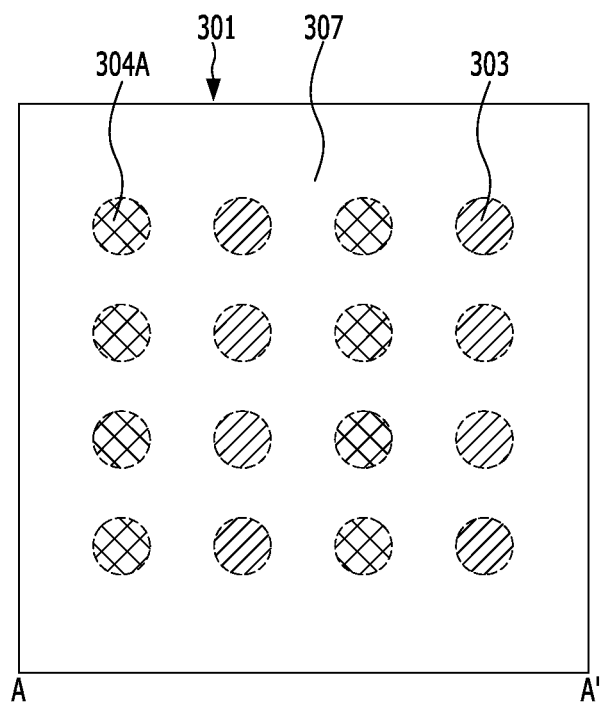
Figure 7F:
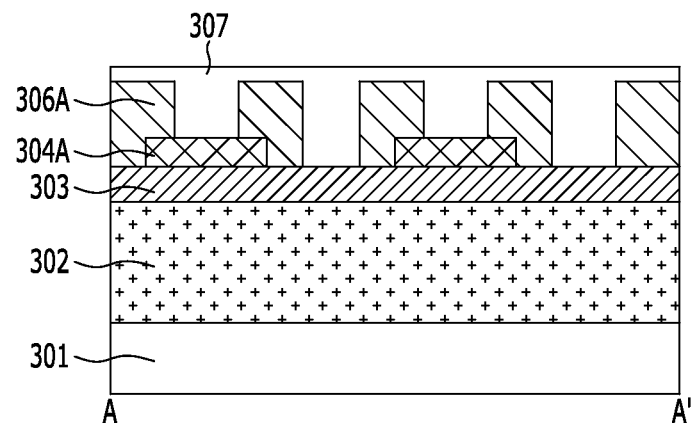

Referring to FIGS. 6F and 7F, a block copolymer 307 is formed to have a thickness enough to fill or cover the spaces between the hole patterns defined by the second photoresist pattern 306A. The block copolymer 307 may include a block copolymer which includes a polymer with a hydrophilic group and a polymer with a hydrophobic group, and may have a characteristic that it is self-assembled with heat.

Figure 6G:
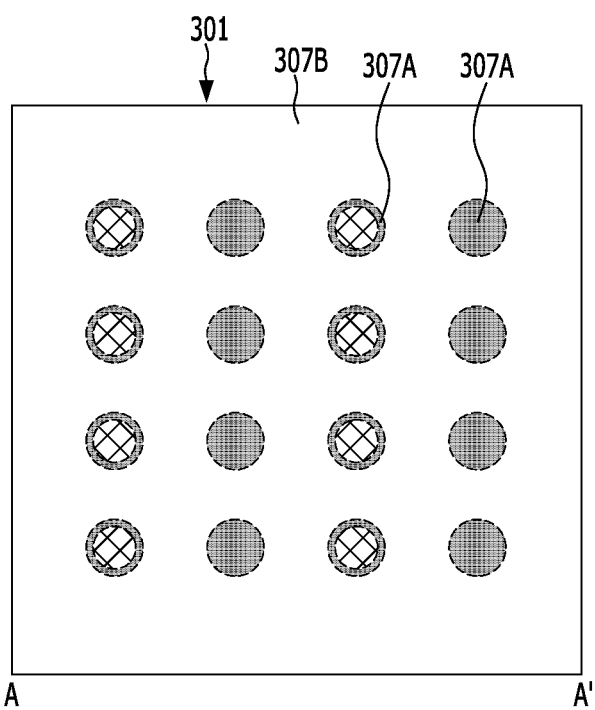
Figure 7G:
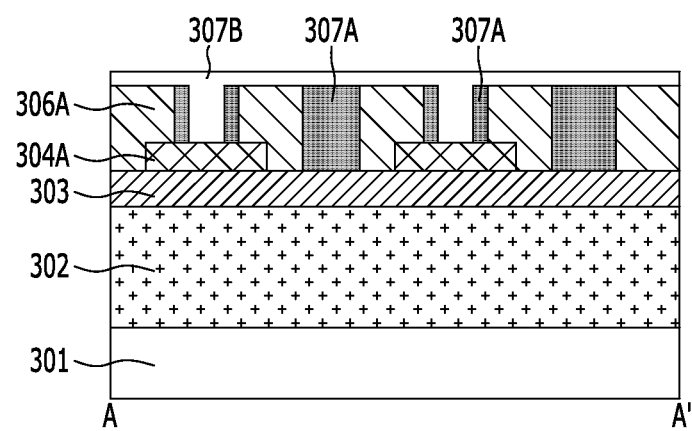

Referring to FIGS. 6G and 7G, the block copolymer 307 is self-assembled. The self-assembling may be performed by a bake process. The self-assembling of the block copolymer 307 may be performed by other processes than the base process, which enables self-assembling. By self-assembling of the block copolymer 307, a hydrophilic polymer 307A and a hydrophobic polymer 307B are assembled. A hydrophobic polymer 307B is assembled on the neutral material patterns 304A, for example, in the center portions of the hole patterns defined on the neutral material patterns 304A. As illustrated in the specific example of FIG. 7G, the hydrophobic polymer 307B is assembled between the sidewalls of the hole patterns defined on the neutral material patterns 304A. A hydrophilic polymer 307A is assembled on the sidewalls of the hole patterns defined on the neutral material patterns 304A and in hole patterns through which the second hard mask layer 303 is exposed. For example, as illustrated in the specific example in FIG. 7G, the hydrophilic polymer 307A is assembled on each sidewall of the hole patterns defined on the neutral material patterns 304A and also assembled to cover or fill the hole patterns defined on the second hard mask layer 303.

Figure 6H:
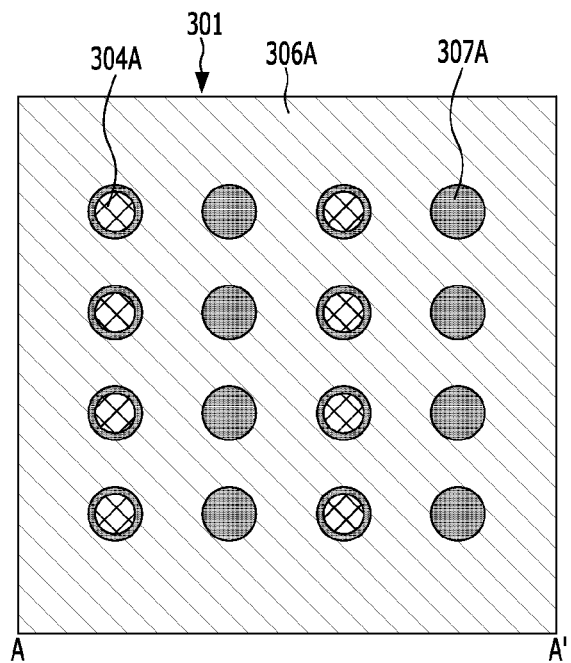
Figure 7H:
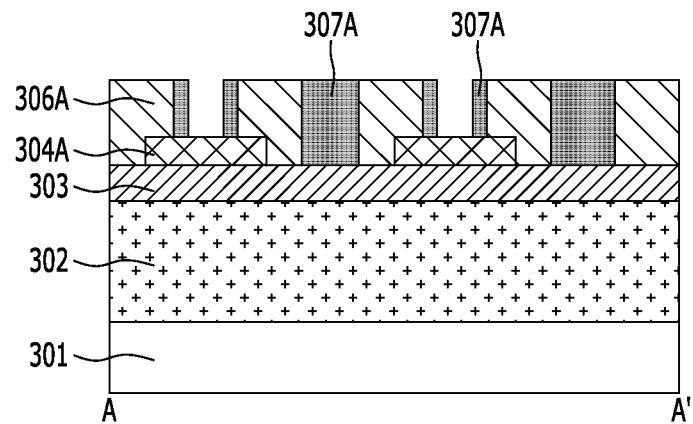

Referring to FIGS. 6H and 7H, the hydrophobic polymer 307B is selectively removed. A removal process may be performed using a material which has an etching selectivity with respect to the hydrophilic polymer 307A, such that the hydrophobic polymer 307B is selectively removed.

In the regions where the neutral material patterns 304A are exposed, the hydrophilic polymer 307A may remain on only the sidewalls of the hole patterns of the second photoresist pattern 306A in the form of spacers. In the regions where the neutral material patterns 304A are not present, all the hole patterns defined by the second photoresist pattern 306A may be filled or covered by the hydrophilic polymer 307A.

Figure 6I:
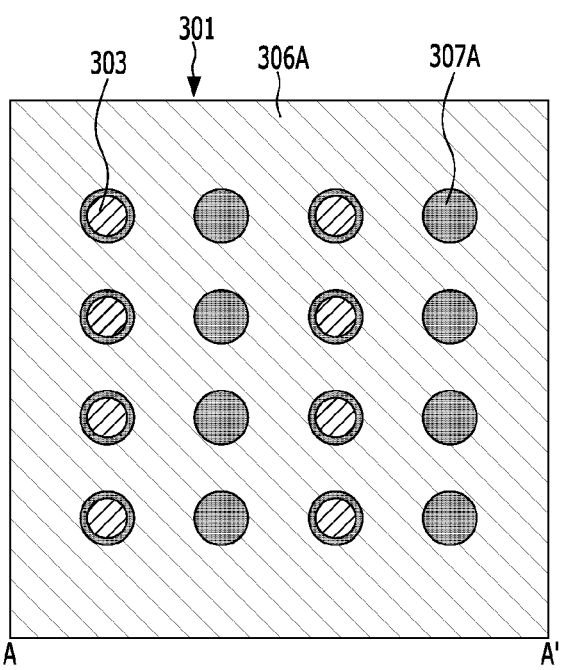
Figure 7I:
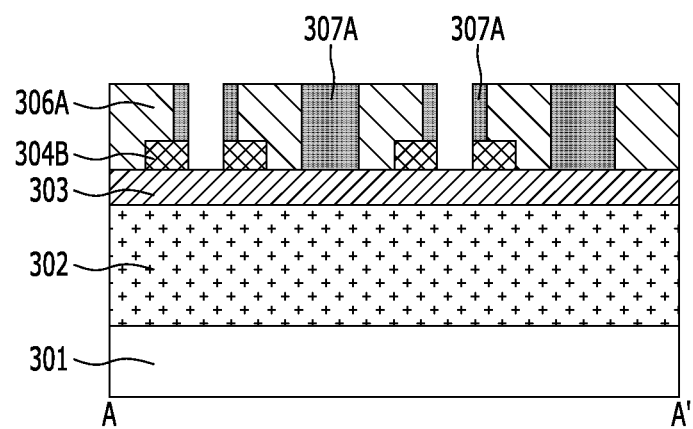

Referring to FIGS. 6I and 7I, the neutral material patterns 304A are etched using the hydrophilic polymer 307A and the second photoresist pattern 306A as etch barriers. The etched neutral material patterns will be indicated by the reference numeral 304B.

As the neutral material patterns 304B are etched, the underlying second hard mask layer 303 may be exposed.

Figure 6J:
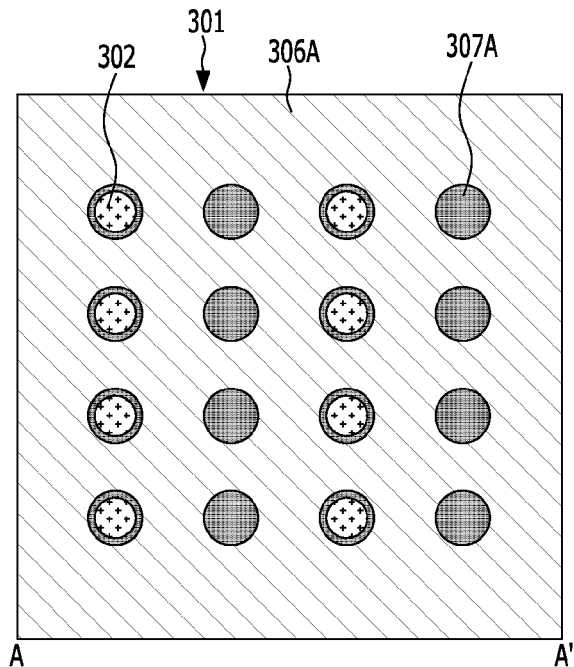
Figure 7J:
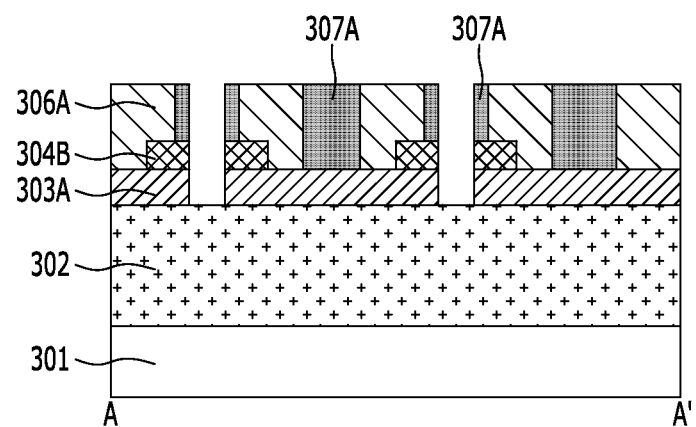

Referring to FIGS. 6J and 7J, the second hard mask layer 303 is etched using the hydrophilic polymer 307A and the second photoresist pattern 306A as etch barriers. Hereinafter, the etched second hard mask layer 303 will be referred to as a second hard mask pattern 303A.

Figure 6K:
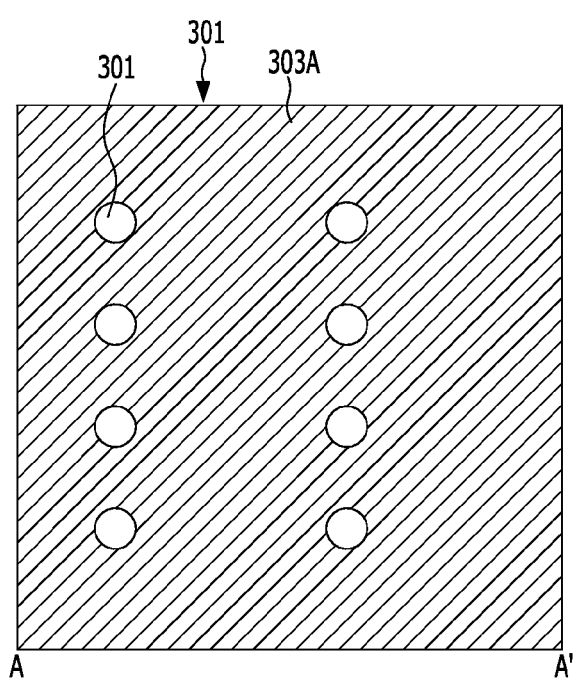
Figure 7K:
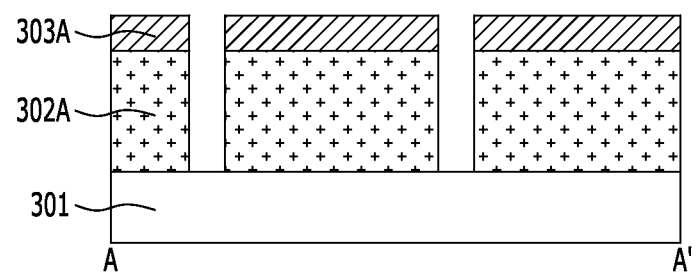

Referring to FIGS. 6K and 7K, the hydrophilic polymer 307A, the second photoresist pattern 306A, and the neutral material patterns 304B are removed.

The second hard mask pattern 303A is patterned to define hole patterns of an asymmetrical arrangement with different longitudinal and transverse intervals. This is because, in FIG. 6G, the hydrophilic polymer 307A fills or covers all the hole patterns defined by the second photoresist pattern 306A in the regions where the neutral material patterns 304A are not present, such that the underlying second hard mask layer 303 is not exposed and thus the etching processes of FIGS. 6I and 6J are not performed. For example, the etching processes of FIGS. 7I and 7J affect only the hole patterns defined in the regions including the neutral material patterns 304A and does not affect the hole patterns defined in the regions not including the neutral material patterns 304A.

Consequently, the second hard mask pattern 303A may define the hole patterns of an asymmetrical arrangement with a transverse interval greater than a predetermined longitudinal interval.

The first hard mask layer 302 is etched using the second hard mask pattern 303A as an etch barrier. Hereinafter, the etched first hard mask layer 302 will be referred to as a first hard mask pattern 302A.

Figure 6L:
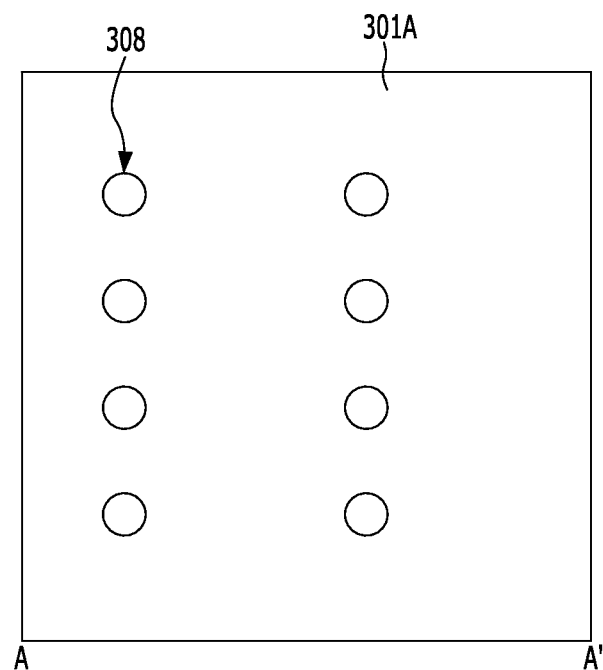
Figure 7L:
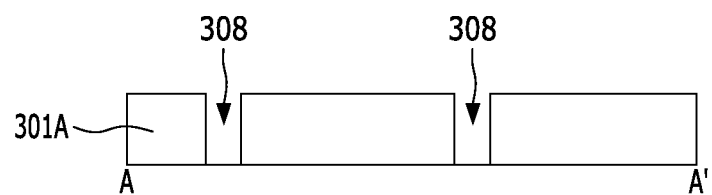

Referring to FIGS. 6L and 7L, by etching the sacrificial layer 301 using the second and first hard mask patterns 303A and 302A as etch barriers, a sacrificial pattern 301A is formed to define hole patterns 308 of an asymmetrical arrangement with different transverse and longitudinal intervals.

The second and first hard mask patterns 303A and 302A may be removed through a removal process when the hole patterns 308 are formed or after the hole patterns 308 are formed.

Accordingly, the sacrificial pattern 301A is formed to define the hole patterns 308 of an asymmetrical arrangement with the different longitudinal and transverse intervals.

In the present implementation, by locally forming neutral material patterns, forming a block copolymer including a hydrophobic polymer and a hydrophilic polymer, and enabling self-assembling through a baking process, it is possible to form hole patterns of an asymmetrical arrangement with different longitudinal and transverse intervals.

As one example, in the present implementation, the hole patterns provide an asymmetrical arrangement with the transverse interval of the hole patterns greater than the longitudinal interval of the hole patterns. In other configurations, various changes can be made for the asymmetrical arrangement of the hole patterns.

Figure 8:
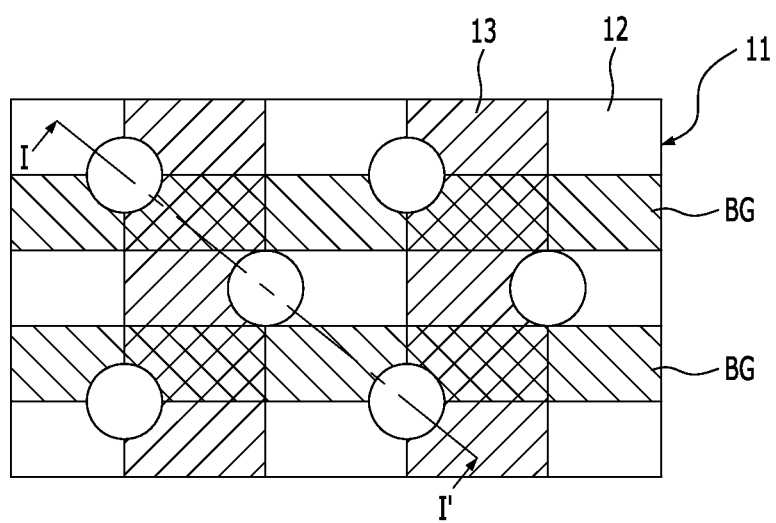
FIG. 8 is an exemplary plan view illustrating a semiconductor device.

FIG. 8 is an exemplary plan view illustrating a semiconductor device in accordance with an implementation of the present disclosure.

Referring to FIG. 8, an isolation layer 12 may be formed in a substrate 11 and line type active regions 13 may be formed. Further, switching elements (buried gates) BG may be formed along a direction crossing the active regions 13. In other implementations, various changes can be made for the active regions and switching elements. The active regions 13 may further include island type active regions, and the switching elements BG may further include various applicable gate types including a recess gate type, a planar gate type and a vertical gate type.

Variable resistance elements, source line contacts, and so forth may be formed on the active regions 13. The variable resistance elements and the source line contacts may be repeatedly disposed to provide staggered arrangement with respect to each other. The source line contacts may be disposed between pairs of switching elements BG. The variable resistance elements may be disposed in a matrix shape, and the source line contacts may be disposed such that each source line contact has the same interval with respect to a plurality of variable resistance elements.

Figure 9A:
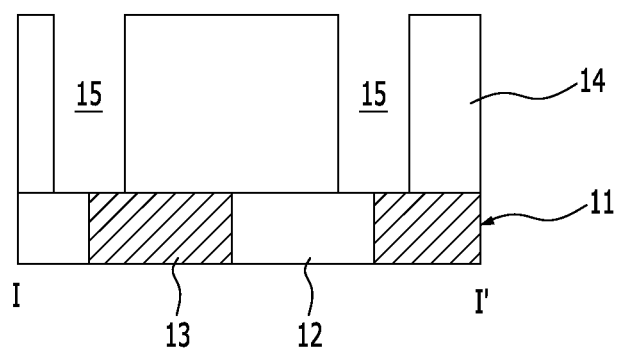
FIGS. 9A to 9I are exemplary cross-sectional views explaining a method for fabricating a semiconductor device in FIG. 9I which shows an exemplary cross-sectional view taken along the line I-I' of FIG. 8.
Figure 9B:
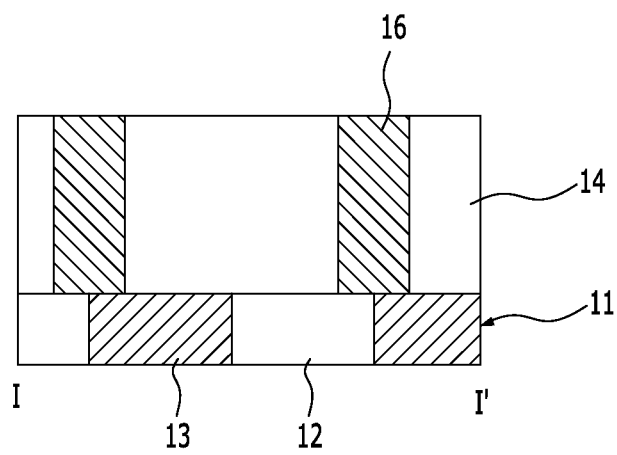
Figure 9C:
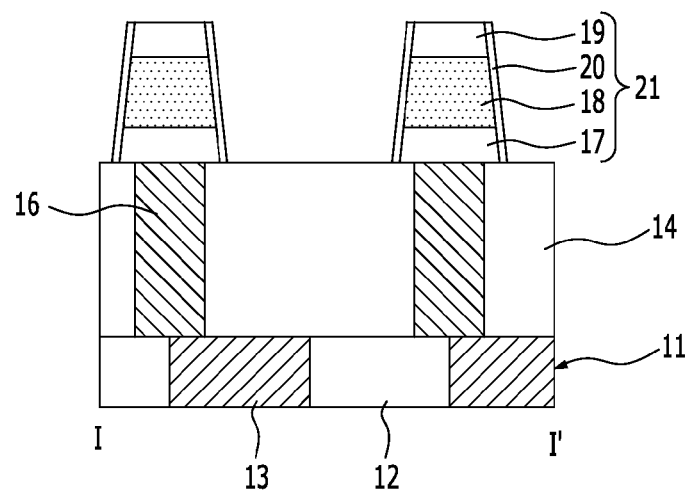
Figure 9D:
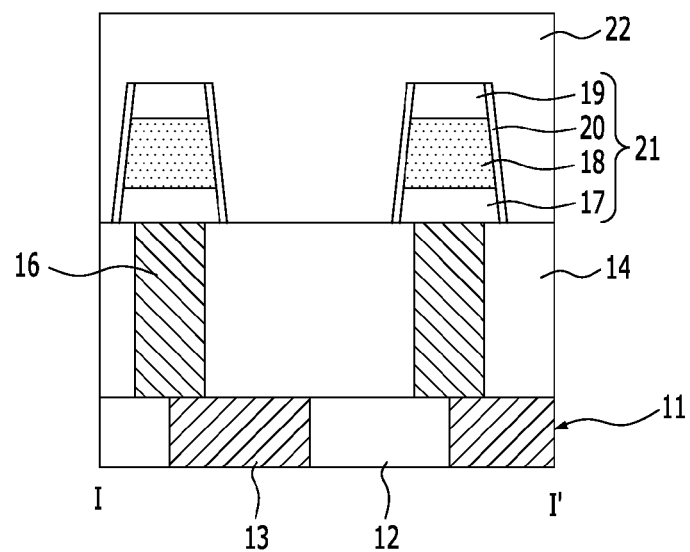
Figure 9E:
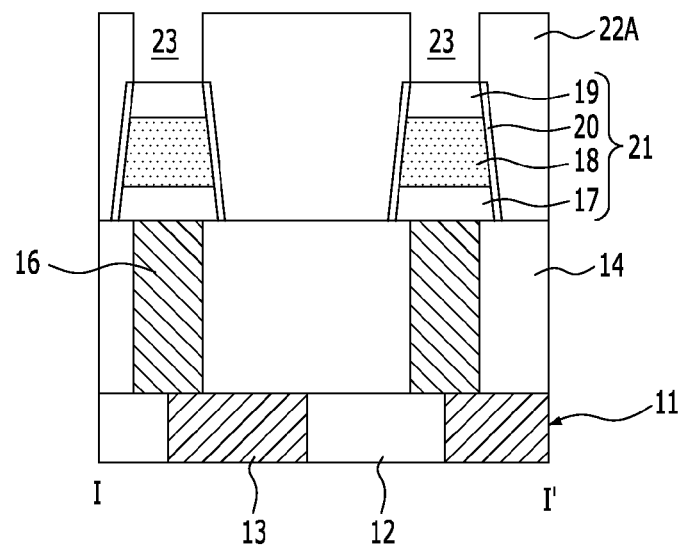
Figure 9F:
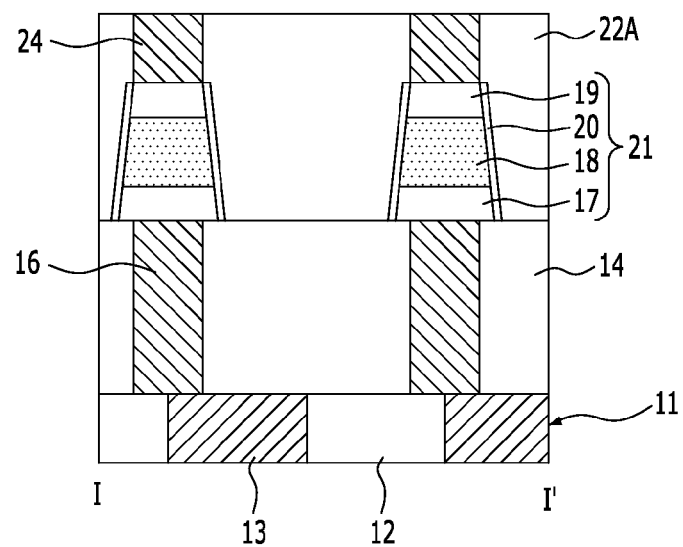
Figure 9G:
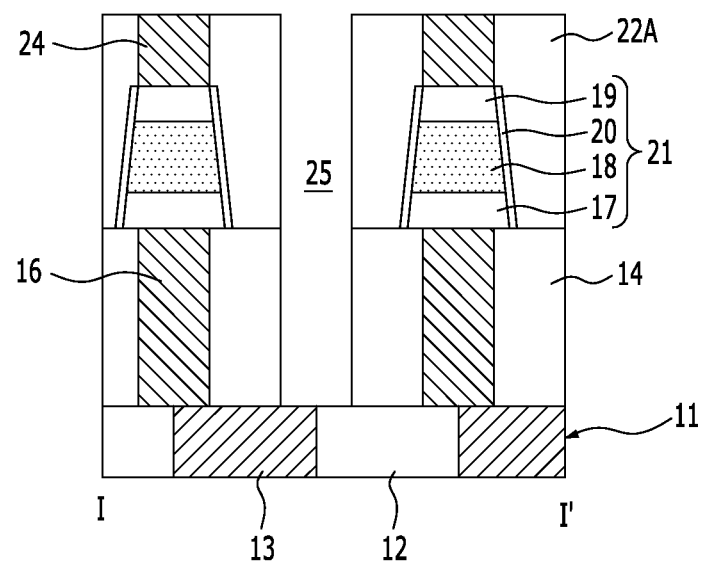
Figure 9H:
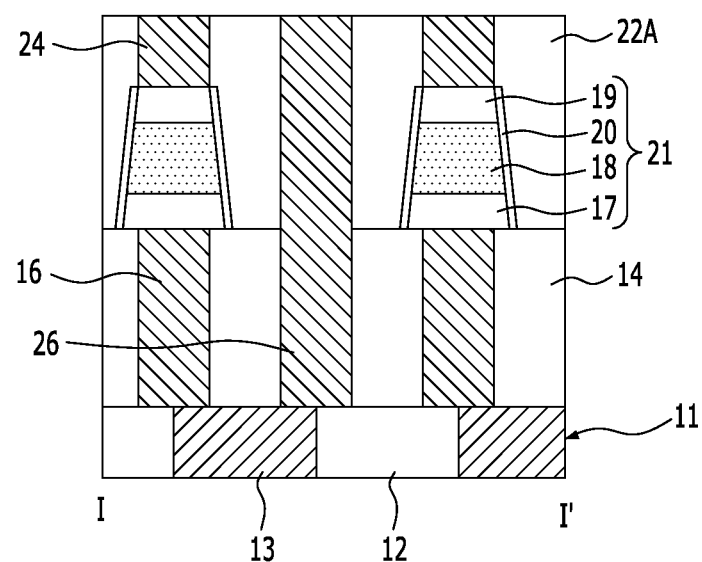
Figure 9I:
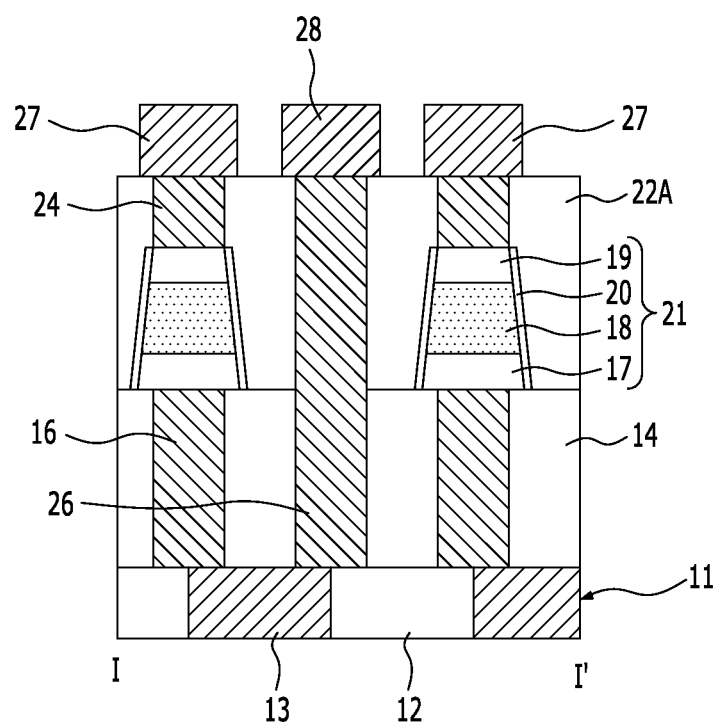

FIGS. 9A through 9I are exemplary cross-sectional views explaining a method for fabricating a semiconductor device in FIG. 9I which shows an exemplary cross-sectional view taken along the line I-I' of FIG. 8.

Referring to FIGS. 9A through 9I, the semiconductor device in accordance with the present implementation may include a substrate 11 with predetermined desired structures For example, the predetermined desired structures may include switching elements, an isolation layer 12 which is formed in the substrate 11, and active regions 13 which are defined by the isolation layer 12. The semiconductor device may further include a first interlayer dielectric layer 14 which is formed on the substrate 11, and first contact plugs 16 which pass through the first interlayer dielectric layer 14 and electrically connect one ends of the switching elements with variable resistance elements 21. The variable resistance elements 21 may be formed on the first interlayer dielectric layer 14.

The semiconductor device may further include a second interlayer dielectric layer 22A which fills or covers the spaces between the variable resistance elements 21, and first and second conductive lines 27 and 28 which are formed on the second interlayer dielectric layer 22A. Also, the semiconductor device may further include second contact plugs 24 which pass through the second interlayer dielectric layer 22A over the variable resistance elements 21 and electrically connect the variable resistance elements 21 with the first conductive lines 27.

The semiconductor device may further include third contact plugs 26 which pass through the first and second interlayer dielectric layers 14 and 22A between the variable resistance elements 21 and connect the second conductive lines 28 with the substrate 11.

Each of the variable resistance elements 21 may include the stack structure including a first electrode 17, a variable resistance layer 18 and a second electrode 19, and may further include spacers 20 which are formed on the sidewalls of the stack structure. The variable resistance element 21 may have a characteristic that it is switched between different resistant states (or different resistance values) according to the biases (for example, voltages or current) applied through the first electrode 17 or/and the second electrode 19.

Such a characteristic may be utilized in various fields. For instance, the variable resistance element 21 may be used as a data storage for storing data.

The variable resistance layer 18 in the storage device may have a variable resistance characteristic in response to a bias applied through the first electrode 17 or/and the second electrode 19, and may include a single layer or multiple layers. For example, the variable resistance layer 18 may include a phase change material. The phase change material may include a chalcogen compound. The phase change material is changed in the phase thereof to an amorphous state or a crystalline state in response to external stimuli (for example, voltages or current), and may have a characteristic that phase-change materials switch between different resistant states. Further, the variable resistance layer 18 may include a metal oxide. The metal oxide may include a transition metal oxide (TMO), a perovskite-based oxide, and so forth. The metal oxide includes vacancies therein, and may have a characteristic that it is switched between different resistant states due to generation and vanishment of a conductive path according to the behavior of the vacancies by external stimuli. Besides, the variable resistance layer 18 may include a stack layer in which a tunnel barrier layer is interposed between two magnetic layers. The stack layer in which a tunnel barrier layer is interposed between two magnetic layers is referred to as a magnetic tunnel junction (MTJ). The stack layer in which a tunnel barrier layer is interposed between two magnetic layers may have a characteristic that it is switched between different resistant states according to the magnetization directions of the two magnetic layers. For instance, in the case where the magnetization directions of the two magnetic layers are the same with (or parallel to) each other, the variable resistance layer 18 may have a low resistant state, and in the case where the magnetization directions of the two magnetic layers are different from (or anti-parallel to) each other, the variable resistance layer 18 may have a high resistant state. The above MTJ structure is one of various implementations for achieving a variable resistance characteristic that switching may be made between different resistant states according to the biases applied to the first electrode 17 or the second electrode 19 or both. Other implementations are possible.

The switching elements are used to select particular unit cells in a semiconductor device which has a plurality of unit cells, and may be disposed in the respective unit cells. The switching elements may include transistors, diodes, and the likes. One ends of the switching elements may be electrically connected with the first contact plugs 16, and the other ends of the switching elements may be electrically connected with source lines through the third contact plugs 26.

The first and second contact plugs 16 and 24 may include semiconductor layers or metallic layers. The line width (or area) of the variable resistance elements 21 may be greater than the line width (or area) of the first and second contact plugs 16 and 24. The first and second contact plugs 16 and 24 may be disposed at the same positions when viewed from the top. The first contact plugs 16 or the second contact plugs 24 or both may be disposed to have an asymmetrical arrangement with different longitudinal and transverse intervals.

The third contact plugs 26 may electrically connect the substrate 11 with the second conductive lines 28, for example, the source lines. Such contact plugs are referred to as source line contacts (SLC). The third contact plugs 26 may be disposed to provide staggered arrangement with respect to the variable resistance elements 21 as shown in FIG. 6 such that the third contact plugs 26 are not placed on the same lines as the variable resistance elements 21. The third contact plugs 26 may be disposed to have an asymmetrical arrangement with different longitudinal and transverse intervals.

FIGS. 9A to 9 further explain a method for fabricating a semiconductor device in accordance with an implementation of this patent document. FIGS. 9A to 9I are exemplary cross-sectional views taken along the line I-I' of FIG. 8.

Referring to FIG. 9A, a substrate 11, which is formed with predetermined desired structures, for example, switching elements (not shown), is provided. The substrate 11 may include an isolation layer 12 which is formed in the substrate 11, and active regions 13 which are defined by the isolation layer 12. The switching elements are used to select particular unit cells in a semiconductor device which has a plurality of unit cells, and may include transistors, diodes, and the likes. One ends of the switching elements may be electrically connected with first contact plugs which will be described later, and the other ends of the switching elements may be electrically connected with source lines through third contact plugs which will be described later.

A first interlayer dielectric layer 14 is formed on the substrate 11. The first interlayer dielectric layer 14 may be formed as any one single layer including an oxide layer, a nitride layer and an oxynitride layer, or a stack layer in which the above layers are stacked.

First contact holes 15 are formed through the first interlayer dielectric layer 14 to expose the substrate 11. The first contact holes 15 may have hole patterns with an asymmetrical arrangement with different longitudinal and transverse intervals. A process for forming the first contact holes 15 may be performed using the mask pattern fabrication method according to one of the first to third implementations described above with reference to FIGS. 1A to 7L. The sacrificial patterns 101A, 201A and 301A described in the respective implementations may correspond to the first interlayer dielectric layer 14, and the hole patterns 109, 210 and 308 may correspond to the first contact holes 15.

In the process of defining the first contact holes 15 by applying the mask pattern fabrication method in accordance with the present implementation, light does not act differently in longitudinal and transverse directions. Thus, non-uniformity of hole patterns due to the effects of light may be improved, thereby increasing the yield of a semiconductor device.

Referring to FIG. 9B, first contact plugs 16 are formed by gap-filling a conductive material in the first contact holes 15. The first contact plugs 16 may be formed through a series of processing procedures in which a conductive material is formed on the entire surface to perform gap-filling the first contact holes 15. Then, an isolation process is performed for electrically isolating adjacent contact plugs. The isolation process may be performed for etching (or polishing) the conductive material formed on the entire surface until the first interlayer dielectric layer 14 is exposed, by using a blanket etching (for example, etch-back) or chemical mechanical polishing (CMP) process.

Referring to FIG. 9C, variable resistance elements 21 are formed on the first interlayer dielectric layer 14 including the first contact plugs 16. The variable resistance elements 21 are connected to the substrate 11 through the first contact plugs 16. Each of the variable resistance elements 21 may include the stack structure of a first electrode 17, a variable resistance layer 18 and a second electrode 19, and may further include spacers 20 which are formed on the sidewalls of the stack structure.

The variable resistance element 21 may have a characteristic that it is switched between different resistant states (or different resistance values) according to the biases (for example, voltages or current) applied through the first electrode 17 or/and the second electrode 19. Such a characteristic may be utilized in various fields. For instance, the variable resistance element 21 may be used as a data storage for storing data.

The variable resistance layer 18 in the storage device may have a variable resistance characteristic by the biases applied through the first electrode 17 or/and the second electrode 19, and may include a single layer or multiple layers. For example, the variable resistance layer 18 may include a phase change material. The phase change material may include a chalcogen compound. The phase change material is changed in the phase thereof to an amorphous state or a crystalline state by external stimuli (for example, voltages or current), and may have a characteristic that it is switched between different resistant states. Further, the variable resistance layer 18 may include a metal oxide. The metal oxide may include a transition metal oxide (TMO), a perovskite-based oxide, and so forth. The metal oxide includes vacancies therein, and may have a characteristic that it is switched between different resistant states due to generation and vanishment of a conductive path according to the behavior of the vacancies by external stimuli. Besides, the variable resistance layer 18 may include a stack layer in which a tunnel barrier layer is interposed between two magnetic layers. The stack layer in which a tunnel barrier layer is interposed between two magnetic layers is referred to as a magnetic tunnel junction (MTJ). The stack layer in which a tunnel barrier layer is interposed between two magnetic layers may have a characteristic that it is switched between different resistant states according to the magnetization directions of the two magnetic layers. For instance, in the case where the magnetization directions of the two magnetic layers are the same with (or parallel to) each other, the variable resistance layer 18 may have a low resistant state, and in the case where the magnetization directions of the two magnetic layers are different from (or anti-parallel to) each other, the variable resistance layer 18 may have a high resistant state. The above MTJ structure is one of various implementations for achieving a variable resistance characteristic that switching may be made between different resistant states according to the biases applied to the first electrode 17 or the second electrode 19 or both. Other implementations are possible.

Each of the first electrode 17 and the second electrode 21 may include a metallic layer. The metallic layer may include a conductive layer having a metal element, and may include a metal layer, a metal oxide layer, a metal nitride layer, a metal oxynitride layer, a metal silicide layer, and so forth.

The first electrode 17 serves as the bottom electrode of the variable resistance element 21. The second electrode 19 serves as the top electrode of the variable resistance element 21 and may protect the variable resistance element 21 and the first electrode 17 during a process.

The spacers 20 may include a dielectric material. For example, the spacers 20 may be any one single layer including an oxide layer, a nitride layer and an oxynitride layer, or a stack layer in which these layers are stacked.

Referring to FIG. 9D, a second interlayer dielectric layer 22 is formed on the first interlayer dielectric layer 14 and the variable resistance elements 21. The second interlayer dielectric layer 22 may be formed to a have thickness enough to fill the spaces between the variable resistance elements 21. For instance, the second interlayer dielectric layer 22 may be formed to have a thickness greater than the top surfaces of the variable resistance elements 21. The second interlayer dielectric layer 22 may be formed using the same material as the first interlayer dielectric layer 14. The second interlayer dielectric layer 22 may be formed as any one single layer including, for example, an oxide layer, a nitride layer and an oxynitride layer, or a stack layer in which these layers are stacked.

Referring to FIG. 9E, by selectively etching the second interlayer dielectric layer 22, second contact holes 23 are defined to expose the top surfaces of the variable resistance elements 21. The etched second interlayer dielectric layer will be indicated by the reference numeral 22A.

The second contact holes 23 may be formed to have hole patterns of an asymmetrical arrangement with different longitudinal and transverse intervals. A process for forming the second contact holes 23 may be performed using the mask pattern fabrication method according to one of the first to third implementations described above with reference to FIGS. 1A to 7L.

In the process of defining the second contact holes 23 by applying the mask pattern fabrication method in accordance with the present implementation, light does not act differently in longitudinal and transverse directions. Thus, non-uniformity of hole patterns due to the effects of light may be improved, thereby increasing the yield of a semiconductor device.

Referring to FIG. 9F, second contact plugs 24 are formed by gap-filling a conductive material in the second contact holes 23. The second contact plugs 24 may be formed through a series of processing procedures. A conductive material is formed on the entire surface to perform gap-filling the second contact holes 23. Then, an isolation process for electrically isolating adjacent contact plugs is performed. The isolation process may be performed for etching (or polishing) the conductive material formed on the entire surface until the second interlayer dielectric layer 22A is exposed, by using a blanket etching (for example, etch-back) or chemical mechanical polishing (CMP) process.

Referring to FIG. 9G, by selectively etching the second and first interlayer dielectric layers 22A and 14 between adjacent variable resistance elements 21, third contact holes 25 are formed to expose the substrate 11.

The third contact holes 25 may be formed to have hole patterns of an asymmetrical arrangement with different longitudinal and transverse intervals. A process for forming the third contact holes 25 may be performed using the mask pattern fabrication method according to one of the first to third implementations described above with reference to FIGS. 1A to 7L.

In the process of defining the third contact holes 25 by applying the mask pattern fabrication method in accordance with the present implementation, light does not act differently in longitudinal and transverse directions. Thus, non-uniformity of hole patterns due to the effects of light may be improved, thereby increasing the yield of a semiconductor device.

Referring to FIG. 9H, third contact plugs 26 are formed by gap-filling a conductive substance in the third contact holes 25. The third contact plugs 26 may be formed through a series of processing procedures. A conductive material is formed on the entire surface to perform gap-filling the third contact holes 25. Then, an isolation process is performed for electrically isolating adjacent contact plugs is performed. The isolation process may be performed for etching (or polishing) the conductive material formed on the entire surface until the second interlayer dielectric layer 22A is exposed, by using a blanket etching (for example, etch-back) or chemical mechanical polishing (CMP) process.

Referring to FIG. 9I, first and second conductive lines 27 and 28 are formed on the second interlayer dielectric layer 22A including the second and third contact plugs 24 and 26.

Each of the first and second conductive lines 27 and 28 may include a metallic layer. The metallic layer may include a conductive layer having a metal element, and may include a metal layer, a metal oxide layer, a metal nitride layer, a metal oxynitride layer, a metal silicide layer, and so forth. The first and second conductive lines 27 and 28 may be simultaneously formed by applying the same mask. Depending on components connected thereto, the first conductive lines 27 may form bit lines, and the second conductive lines 28 may form source lines.

The memory circuits or the semiconductor devices according to the above-described implementations may be used in various devices or systems.

The above and other memory circuits or semiconductor devices based on the disclosed technology can be used in a range of devices or systems. FIGS. 10-14 provide some examples of devices or systems that can implement the memory circuits disclosed herein.

Figure 10:
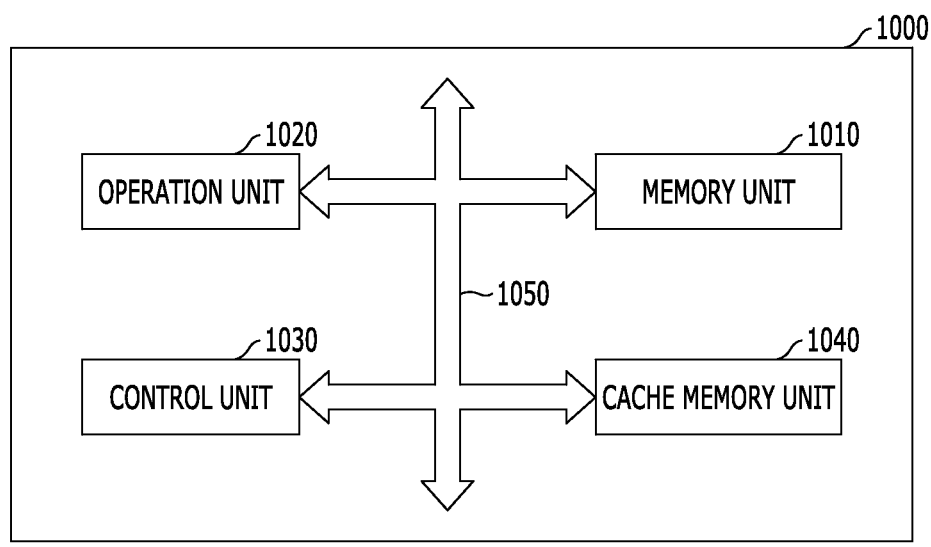
FIG. 10 is an example of configuration diagram of a microprocessor implementing memory circuitry based on the disclosed technology.

FIG. 10 is an example of configuration diagram of a microprocessor implementing memory circuitry based on the disclosed technology.

Referring to FIG. 10, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include a first interlayer dielectric layer formed over a substrate; first contact plugs connected to the substrate by passing through the first interlayer dielectric layer and having an asymmetrical arrangement with different longitudinal and transverse intervals; variable resistance elements connected to the first contact plugs; a second interlayer dielectric layer formed over an entire structure including the first interlayer dielectric layer; second contact plugs connected to the variable resistance elements by passing through the second interlayer dielectric layer; third contact plugs connected to the substrate by passing through the second and first interlayer dielectric layers between adjacent variable resistance elements; and conductive lines connected to the second contact plugs and the third contact plugs.

The first to third contact holes have an asymmetrical arrangement with different longitudinal and transverse intervals. A process for forming the first to third contact holes may be performed using the mask pattern fabrication method according to one of the first to third implementations described above with reference to FIGS. 1A to 7L. In the process for defining the first contact holes 15 by applying the mask pattern fabrication method in accordance with the present implementation, light does not act differently in longitudinal and transverse directions. Thus, non-uniformity of hole patterns due to the effects of light may be improved, thereby increasing the yield of a semiconductor device and reducing a size of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 11:
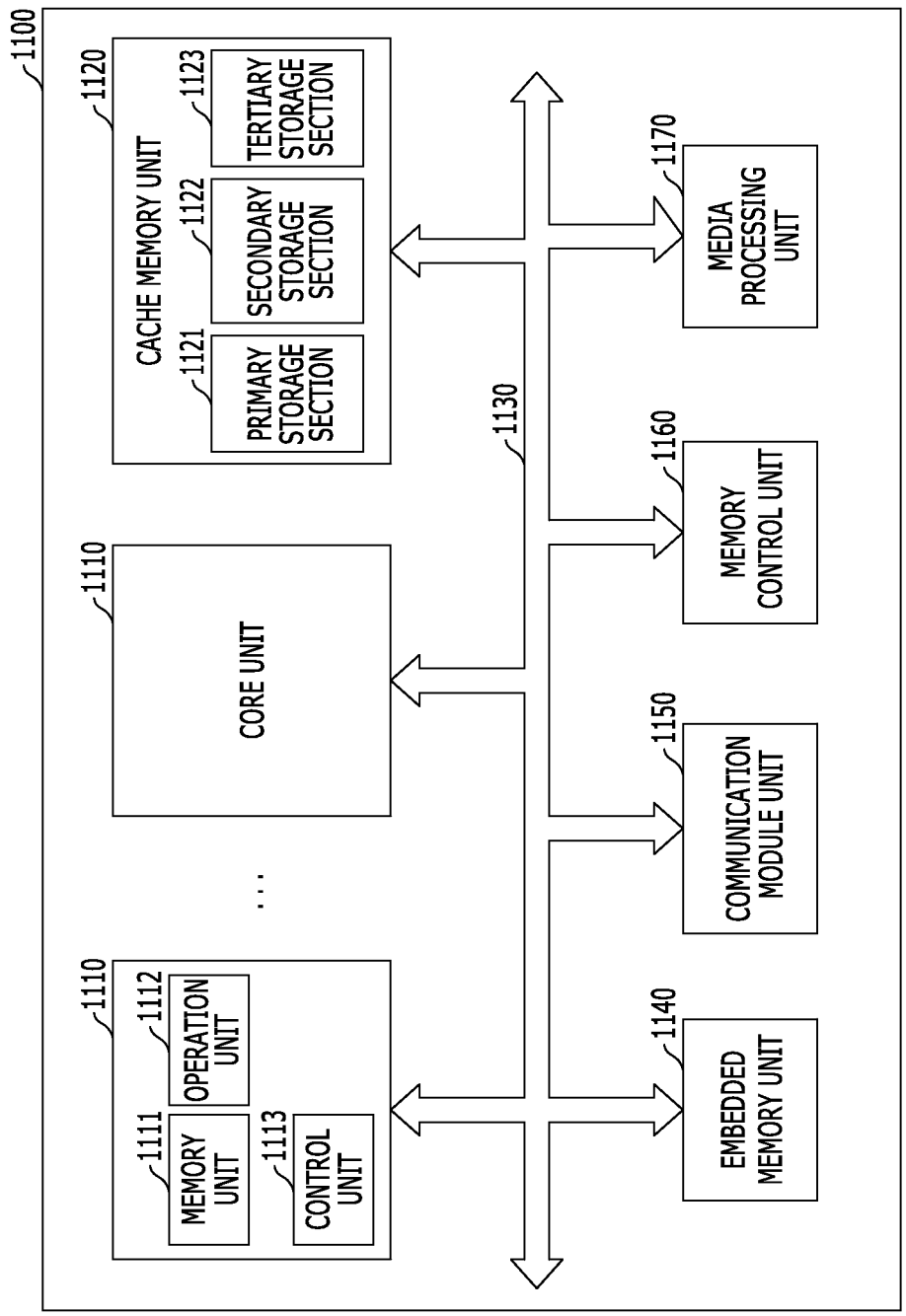
FIG. 11 is an example of configuration diagram of a processor implementing memory circuitry based on the disclosed technology.

FIG. 11 is an example of configuration diagram of a processor implementing memory circuitry based on the disclosed technology.

Referring to FIG. 11, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first interlayer dielectric layer formed over a substrate; first contact plugs connected to the substrate by passing through the first interlayer dielectric layer and having an asymmetrical arrangement with different longitudinal and transverse intervals; variable resistance elements connected to the first contact plugs; a second interlayer dielectric layer formed over an entire structure including the first interlayer dielectric layer; second contact plugs connected to the variable resistance elements by passing through the second interlayer dielectric layer; third contact plugs connected to the substrate by passing through the second and first interlayer dielectric layers between adjacent variable resistance elements; and conductive lines connected to the second contact plugs and the third contact plugs.

The first to third contact holes have an asymmetrical arrangement with different longitudinal and transverse intervals. A process for forming the first to third contact holes may be performed using the mask pattern fabrication method according to one of the first to third implementations described above with reference to FIGS. 1A to 7L. In the process for defining the first contact holes 15 by applying the mask pattern fabrication method in accordance with the present implementation, light does not act differently in longitudinal and transverse directions. Thus, non-uniformity of hole patterns due to the effects of light may be improved, thereby increasing the yield of a semiconductor device and reducing a size of the processor 1100.

Although it was shown in FIG. 11 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 12:
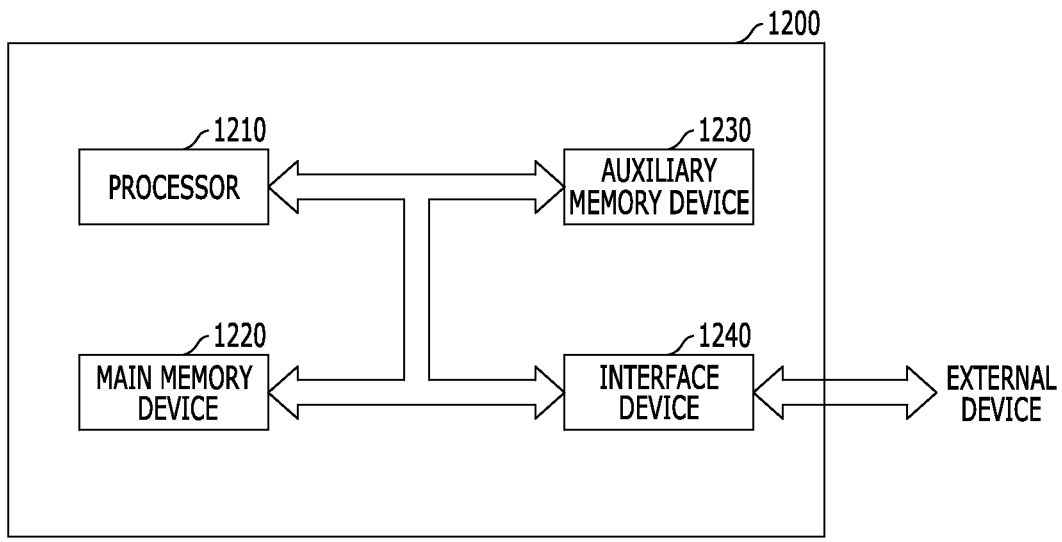
FIG. 12 is an example of configuration diagram of a system implementing memory circuitry based on the disclosed technology.

FIG. 12 is an example of configuration diagram of a system implementing memory circuitry based on the disclosed technology.

Referring to FIG. 12, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first interlayer dielectric layer formed over a substrate; first contact plugs connected to the substrate by passing through the first interlayer dielectric layer and having an asymmetrical arrangement with different longitudinal and transverse intervals; variable resistance elements connected to the first contact plugs; a second interlayer dielectric layer formed over an entire structure including the first interlayer dielectric layer; second contact plugs connected to the variable resistance elements by passing through the second interlayer dielectric layer; third contact plugs connected to the substrate by passing through the second and first interlayer dielectric layers between adjacent variable resistance elements; and conductive lines connected to the second contact plugs and the third contact plugs.

The first to third contact holes have an asymmetrical arrangement with different longitudinal and transverse intervals. A process for forming the first to third contact holes may be performed using the mask pattern fabrication method according to one of the first to third implementations described above with reference to FIGS. 1A to 7L. In the process for defining the first contact holes 15 by applying the mask pattern fabrication method in accordance with the present implementation, light does not act differently in longitudinal and transverse directions. Thus, non-uniformity of hole patterns due to the effects of light may be improved, thereby increasing the yield of a semiconductor device and reducing a size of the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element which includes a free magnetic layer, a tunnel barrier layer and a pinned magnetic layer, and a magnetic correction layer which is disposed over the variable resistance element to be separated from the variable resistance element and has a magnetization direction opposite to a magnetization direction of the pinned magnetic layer. Through this, a fabrication process of the auxiliary memory device 1230 may become easy and the reliability of the auxiliary memory device 1230 may be improved. As a consequence, a fabrication process of the system 1200 may become easy and the reliability of the system 1200 may be improved.

Also, the auxiliary memory device 1230 may further include a data storage system (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 13:
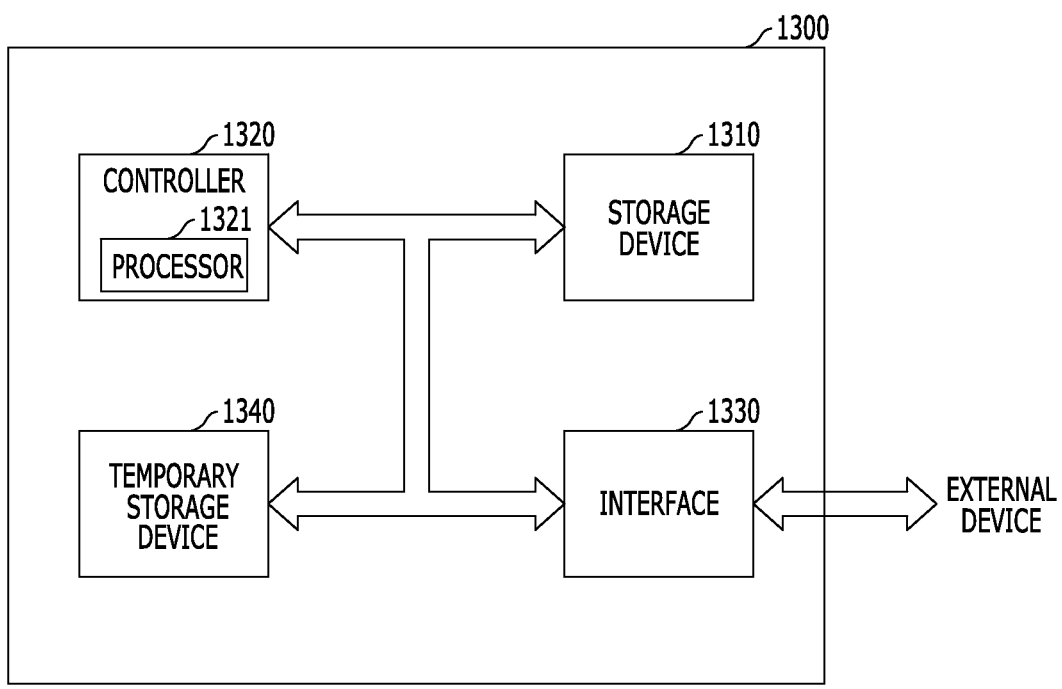
FIG. 13 is an example of configuration diagram of a data storage system implementing memory circuitry based on the disclosed technology.

FIG. 13 is an example of configuration diagram of a data storage system implementing memory circuitry based on the disclosed technology.

Referring to FIG. 13, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first interlayer dielectric layer formed over a substrate; first contact plugs connected to the substrate by passing through the first interlayer dielectric layer and having an asymmetrical arrangement with different longitudinal and transverse intervals; variable resistance elements connected to the first contact plugs; a second interlayer dielectric layer formed over an entire structure including the first interlayer dielectric layer; second contact plugs connected to the variable resistance elements by passing through the second interlayer dielectric layer; third contact plugs connected to the substrate by passing through the second and first interlayer dielectric layers between adjacent variable resistance elements; and conductive lines connected to the second contact plugs and the third contact plugs.

The first to third contact holes have an asymmetrical arrangement with different longitudinal and transverse intervals. A process for forming the first to third contact holes may be performed using the mask pattern fabrication method according to one of the first to third implementations described above with reference to FIGS. 1A to 7L. In the process for defining the first contact holes 15 by applying the mask pattern fabrication method in accordance with the present implementation, since it is not necessary to differentiate the effects of light in longitudinal and transverse directions, non-uniformity of hole patterns due to non-uniformity of the effects of light may be improved, whereby the yield of a semiconductor device may be increased. As a consequence, a size of the data storage system 1300 may be reduced.

Figure 14:
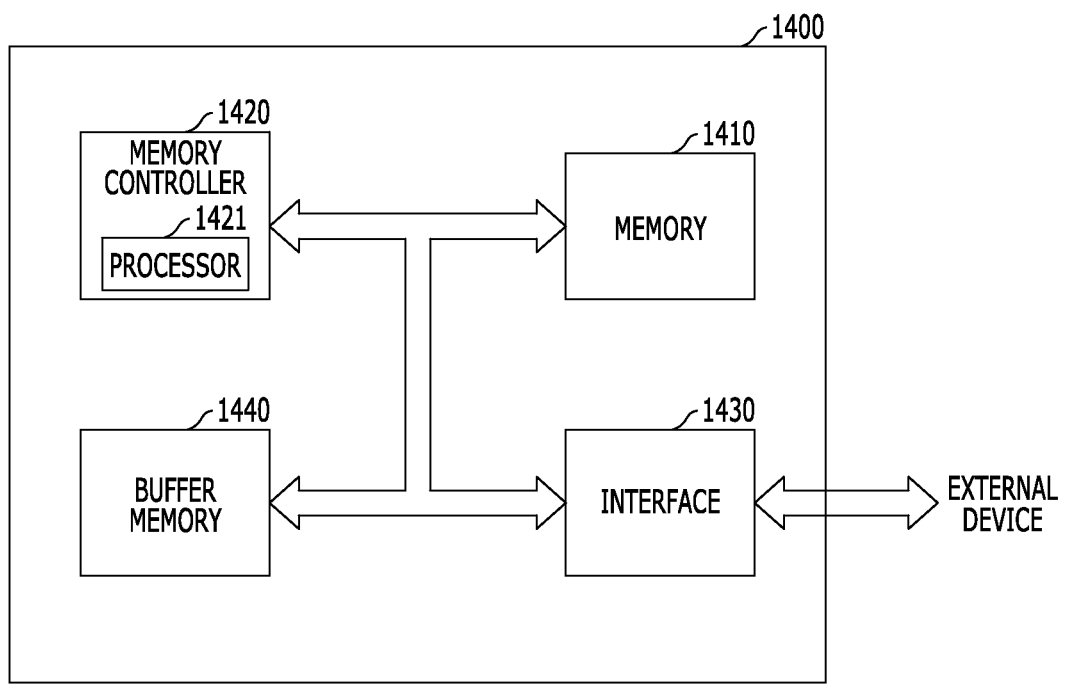
FIG. 14 is an example of configuration diagram of a memory system implementing memory circuitry based on the disclosed technology.

FIG. 14 is an example of configuration diagram of a memory system implementing memory circuitry based on the disclosed technology.

Referring to FIG. 14, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first interlayer dielectric layer formed over a substrate; first contact plugs connected to the substrate by passing through the first interlayer dielectric layer and having an asymmetrical arrangement with different longitudinal and transverse intervals; variable resistance elements connected to the first contact plugs; a second interlayer dielectric layer formed over an entire structure including the first interlayer dielectric layer; second contact plugs connected to the variable resistance elements by passing through the second interlayer dielectric layer; third contact plugs connected to the substrate by passing through the second and first interlayer dielectric layers between adjacent variable resistance elements; and conductive lines connected to the second contact plugs and the third contact plugs.

The first to third contact holes have an asymmetrical arrangement with different longitudinal and transverse intervals. A process for forming the first to third contact holes may be performed using the mask pattern fabrication method according to one of the first to third implementations described above with reference to FIGS. 1A to 7L. In the process for defining the first contact holes 15 by applying the mask pattern fabrication method in accordance with the present implementation, light does not act differently in longitudinal and transverse directions Thus, non-uniformity of hole patterns due to the effects of light may be improved, thereby increasing the yield of a semiconductor device and reducing a size of the memory system 1400.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element which includes a free magnetic layer, a tunnel barrier layer and a pinned magnetic layer, and a magnetic correction layer which is disposed over the variable resistance element to be separated from the variable resistance element and has a magnetization direction opposite to a magnetization direction of the pinned magnetic layer. Through this, a fabrication process of the buffer memory 1440 may become easy and the reliability of the buffer memory 1440 may be improved. As a consequence, a fabrication process of the memory system 1400 may become easy and the reliability of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a variable resistance element is easy, and it is possible to secure the characteristics of the variable resistance element.

Features in the above examples of electronic devices or systems in FIGS. 11-15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device having a semiconductor memory unit, comprising:
   forming a mask pattern which is defined with hole patterns of an asymmetrical arrangement with different longitudinal and transverse intervals, over an etch target layer; and
   etching the etch target layer, using the mask pattern as an etch barrier,
   wherein the forming of the mask pattern comprises:
   forming a photoresist pattern with a plurality of openings which are defined by first regions where optical processing is performed and second regions where optical processing is not performed over a sacrificial layer;
   forming a gap filling layer to fill or cover the openings defined by the second regions of the photoresist pattern; and
   etching the sacrificial layer using the first regions of the photoresist pattern and the gap filling layer as etch barriers, and forming a sacrificial pattern which is defined with the hole patterns of the asymmetrical arrangement with the different longitudinal and transverse intervals.

2. The method according to claim 1, wherein the plurality of openings have uniform longitudinal and transverse intervals.

3. The method according to claim 1, wherein the forming of the gap filling layer comprises:
   forming a reaction layer to fill or cover the openings;
   reacting the second regions of the photoresist pattern with the reaction layer to form a cross-linked layer between the second regions of the photoresist pattern; and
   removing the reaction layer which has not linked.

4. The method according to claim 3, wherein the reaction layer comprises a RELACS (resist enhancement lithography assisted by chemical shrink) layer.

5. The method according to claim 1, wherein the forming of the mask pattern comprises:
   forming pillar patterns with uniform longitudinal and transverse intervals;
   forming a gap filling layer to fill or cover spaces between the pillar patterns;
   etching the gap filling layer to form gap filling patterns so that each gap filling pattern and each pillar pattern are alternately arranged;
   forming line mask patterns over the gap filling patterns and the pillar patterns to include exposed regions where the pillar mask patterns are exposed and non-exposed regions where the pillar mask patterns are not exposed, the exposed regions and the non-exposed regions being alternately arranged;
   removing the pillar patterns which are exposed by the line mask patterns; and
   etching the sacrificial layer using remaining pillar patterns and the gap filling patterns as etch barriers, and forming a sacrificial pattern which is defined with the hole patterns of the asymmetrical arrangement with the different longitudinal and transverse intervals.

6. The method according to claim 1, wherein the forming of the mask pattern comprises:
   forming line neutral material patterns;
   forming a photoresist pattern which is defined with hole patterns with uniform longitudinal and transverse intervals;
   forming a block copolymer which fills or covers the hole patterns and includes a hydrophilic group and a hydrophobic group over the photoresist pattern;
   assembling the block copolymer such that the hydrophobic polymer is formed between sidewalls of the hole patterns formed on the neutral material patterns and that the hydrophilic polymer is formed on the sidewalls of the hole patterns formed on the neutral material pattern and in the hole patterns not formed on the line neutral material patterns;
   selectively removing the polymer with the hydrophobic group; and
   etching the neutral material patterns and the sacrificial layer using the block copolymer and the photoresist pattern as etch barriers, and forming a sacrificial pattern which is defined with the hole patterns of the asymmetrical arrangement with the different longitudinal and transverse intervals.

7. A method for fabricating an electronic device having a semiconductor memory unit, comprising:
   forming a first interlayer dielectric layer over a substrate;
   forming a first mask pattern which is defined with hole patterns of an asymmetrical arrangement with different longitudinal and transverse intervals, over the first interlayer dielectric layer;
   etching the first interlayer dielectric layer using the first mask pattern as an etch barrier, and forming first contact holes to expose the substrate;
   forming first contact plugs by filling or covering a conductive material in the first contact holes;
   forming variable resistance elements to be connected with the first contact plugs;
   forming a second interlayer dielectric layer over the first interlayer dielectric layer and the variable resistance elements;
   forming second contact plugs to pass through the second interlayer dielectric layer and be connected with the variable resistance elements; and
   forming conductive lines over the second interlayer dielectric layer to be connected with the second contact plugs.

8. The method according to claim 7, wherein the forming of the first mask pattern comprises:
   forming a photoresist pattern with a plurality of openings which are defined by first regions having undergone optical processing and second regions not having undergone optical processing, over a sacrificial layer;
   forming a gap filling layer to fill the openings of the second regions of the photoresist pattern not having undergone optical processing; and etching the sacrificial layer using the first regions of the photoresist pattern having undergone optical processing and the gap filling layer as etch barriers, and forming a sacrificial pattern which is defined with the hole patterns of the asymmetrical arrangement with the different longitudinal and transverse intervals.

9. The method according to claim 7, wherein the forming of the first mask pattern comprises:
forming pillar patterns with a uniform longitudinal and transverse interval, over a sacrificial layer;
forming a first gap filling layer to fill spaces among the pillar patterns;
forming line patterns over the first gap filling layer and the pillar patterns such that non-exposed regions and exposed regions through which the pillar patterns are exposed are alternately arranged;
removing the pillar patterns which are exposed by the line patterns; and
etching the sacrificial layer using remaining pillar patterns and the first gap filling layer as etch barriers, and forming a sacrificial pattern which is defined with the hole patterns of the asymmetrical arrangement with the different longitudinal and transverse intervals.

10. The method according to claim 7, wherein the forming of the first mask pattern comprises:
forming line type neutral material patterns over a sacrificial layer;
forming a photoresist pattern which is defined with contact holes with a uniform longitudinal and transverse interval, over the sacrificial layer including the neutral material patterns;
forming a block copolymer which fills the contact holes and includes a hydrophilic group and a hydrophobic group, over the photoresist pattern;
assembling the block copolymer such that, in contact holes defined over the neutral material patterns, a polymer with the hydrophobic group is formed at center portions of the contact holes and a polymer with the hydrophilic group is formed on sidewalls of the contact holes;
selectively removing the polymer with the hydrophobic group; and
etching the neutral material patterns and the sacrificial layer using the block copolymer and the photoresist pattern as etch barriers, and forming a sacrificial pattern which is defined with the hole patterns of the asymmetrical arrangement with the different longitudinal and transverse intervals.

11. The method according to claim 7, wherein the forming of the second contact plugs comprises:
forming a second mask pattern which is defined with hole patterns of an asymmetrical arrangement with different longitudinal and transverse intervals, over the second interlayer dielectric layer;
etching the second interlayer dielectric layer using the second mask pattern as an etch barrier, and forming second contact holes which expose top surfaces of the variable resistance elements; and
forming second contact plugs by filling a conductive material in the second contact holes.

12. The method according to claim 11, wherein the forming of the second mask pattern comprises:
forming a photoresist pattern with a plurality of openings which are defined by first regions having undergone optical processing and second regions not having undergone optical processing, over a sacrificial layer;
forming a gap filling layer to fill the openings of the second regions of the photoresist pattern not having undergone optical processing; and
etching the sacrificial layer using the first regions of the photoresist pattern having undergone optical processing and the gap filling layer as etch barriers, and forming a sacrificial pattern which is defined with the hole patterns of the asymmetrical arrangement with the different longitudinal and transverse intervals.

13. The method according to claim 11, wherein the forming of the second mask pattern comprises:
forming pillar patterns with a uniform longitudinal and transverse interval, over a sacrificial layer;
forming a first gap filling layer to fill spaces among the pillar patterns;
forming line patterns over the first gap filling layer and the pillar patterns such that non-exposed regions and exposed regions of the pillar patterns are alternately repeated;
removing the pillar patterns which are exposed by the line patterns; and
etching the sacrificial layer using remaining pillar patterns and the first gap filling layer as etch barriers, and forming a sacrificial pattern which is defined with the hole patterns of the asymmetrical arrangement with the different longitudinal and transverse intervals.

14. The method according to claim 11, wherein the forming of the second mask pattern comprises:
forming line type neutral material patterns over a sacrificial layer;
forming a photoresist pattern which is defined with contact holes with a uniform longitudinal and transverse interval, over the sacrificial layer including the neutral material patterns;
forming a block copolymer which fills the contact holes and includes a hydrophilic group and a hydrophobic group, over the photoresist pattern;
assembling the block copolymer such that, in contact holes defined over the neutral material patterns, a polymer with the hydrophobic group is formed at center portions of the contact holes and a polymer with the hydrophilic group is formed on sidewalls of the contact holes;
selectively removing the polymer with the hydrophobic group; and
etching the neutral material patterns and the sacrificial layer using the block copolymer and the photoresist pattern as etch barriers, and forming a sacrificial pattern which is defined with the hole patterns of the asymmetrical arrangement with the different longitudinal and transverse intervals.

15. The method according to claim 7, wherein, before the forming of the conductive lines, the method further comprises:
etching the second interlayer dielectric layer and the first interlayer dielectric layer between the variable resistance elements, and forming third contact holes which expose the substrate; and
forming third contact plugs by filling a conductive material in the third contact holes.

16. The method according to claim 15, wherein the forming of the third contact holes comprises:
forming a third mask pattern which is defined with hole patterns of an asymmetrical arrangement with different longitudinal and transverse intervals, over the second interlayer dielectric layer; and etching the second interlayer dielectric layer and the first interlayer dielectric layer using the third mask pattern as an etch barker, and forming the third contact holes which expose the substrate.

17. The method according to claim 16, wherein the forming of the third mask pattern comprises:
   forming a photoresist pattern with a plurality of openings which are defined by first regions having undergone optical processing and second regions not having undergone optical processing, over a sacrificial layer;
   forming a gap filling layer to fill the openings of the second regions of the photoresist pattern not having undergone optical processing; and
   etching the sacrificial layer using the first regions of the photoresist pattern having undergone optical processing and the gap filling layer as etch barriers, and forming a sacrificial pattern which is defined with the hole patterns of the asymmetrical arrangement with the different longitudinal and transverse intervals.

18. The method according to claim 16, wherein the forming of the third mask pattern comprises:
   forming pillar patterns with a uniform longitudinal and transverse interval, over a sacrificial layer;
   forming a first gap filling layer to fill spaces among the pillar patterns;
   forming line patterns over the first gap filling layer and the pillar patterns such that non-exposed regions and exposed regions of the pillar patterns are alternately repeated;
   removing the pillar patterns which are exposed by the line patterns; and
   etching the sacrificial layer using remaining pillar patterns and the first gap filling layer as etch barriers, and forming a sacrificial pattern which is defined with the hole patterns of the asymmetrical arrangement with the different longitudinal and transverse intervals.

19. The method according to claim 16, wherein the forming of the third mask pattern comprises:
   forming line type neutral material patterns over a sacrificial layer;
   forming a photoresist pattern which is defined with contact holes with a uniform longitudinal and transverse interval, over the sacrificial layer including the neutral material patterns;
   forming a block copolymer which fills the contact holes and includes a hydrophilic group and a hydrophobic group, over the photoresist pattern;
   assembling the block copolymer such that, in contact holes defined over the neutral material patterns, a polymer with the hydrophobic group is formed at center portions of the contact holes and a polymer with the hydrophilic group is formed on sidewalls of the contact holes;
   selectively removing the polymer with the hydrophobic group; and
   etching the neutral material patterns and the sacrificial layer using the block copolymer and the photoresist pattern as etch barriers, and forming a sacrificial pattern which is defined with the hole patterns of the asymmetrical arrangement with the different longitudinal and transverse intervals.

* * * * *